(12) United States Patent
Yu et al.

(10) Patent No.: US 10,032,954 B2
(45) Date of Patent: Jul. 24, 2018

(54) LIGHT-EMITTING DEVICE AND MANUFACTURING METHOD THEREOF

(71) Applicant: EPISTAR CORPORATION, Hsinchu (TW)

(72) Inventors: Cheng-Feng Yu, Hsinchu (TW); Ching-Yuan Tsai, Hsinchu (TW); Yao-Ru Chang, Hsinchu (TW); Hsin-Chan Chung, Hsinchu (TW); Shih-Chang Lee, Hsinchu (TW); Wen-Luh Liao, Hsinchu (TW); Cheng-Hsing Chiang, Hsinchu (TW); Kuo-Feng Huang, Hsinchu (TW); Hsu-Hsuan Teng, Hsinchu (TW); Hung-Ta Cheng, Hsinchu (TW); Yung-Fu Chang, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 15/591,544

(22) Filed: May 10, 2017

(65) Prior Publication Data
US 2017/0331001 A1    Nov. 16, 2017

(30) Foreign Application Priority Data

May 11, 2016 (TW) .............................. 105114622 A
Apr. 18, 2017 (TW) .............................. 106112918 A

(51) Int. Cl.
| | | |
|---|---|---|
| *H01L 21/00* | (2006.01) | |
| *H01L 27/15* | (2006.01) | |
| *H01L 33/06* | (2010.01) | |
| *H01L 33/00* | (2010.01) | |
| *H01L 33/30* | (2010.01) | |
| *H01L 33/42* | (2010.01) | |
| *H01L 33/46* | (2010.01) | |
| *H01L 33/62* | (2010.01) | |

(52) U.S. Cl.
CPC ............ *H01L 33/06* (2013.01); *H01L 33/002* (2013.01); *H01L 33/0079* (2013.01); *H01L 33/30* (2013.01); *H01L 33/42* (2013.01); *H01L 33/46* (2013.01); *H01L 33/62* (2013.01); *H01L 2933/0016* (2013.01); *H01L 2933/0066* (2013.01)

(58) Field of Classification Search
CPC ....... H01L 33/002; H01L 33/06; H01L 33/30; H01L 33/405; H01L 33/42; H01L 33/46; H01L 5/0262; H01L 5/0264; H01L 33/54; H01L 33/62; H01L 33/0079
USPC ................ 438/24–29; 257/80–82, 91, 98, 99
See application file for complete search history.

(56) References Cited

U.S. PATENT DOCUMENTS

| | | |
|---|---|---|
| 6,784,462 B2 | 8/2004 | Schubert |
| 9,196,806 B2 | 11/2015 | Lin et al. |
| 9,881,980 B2 * | 1/2018 | Paek ................... H01L 27/3246 |

* cited by examiner

*Primary Examiner* — Hsien Ming Lee
(74) *Attorney, Agent, or Firm* — Juan Carlos A. Marquez; Marquez IP Law Office, PLLC

(57) ABSTRACT

A light-emitting device is provided. The light-emitting device comprises a substrate; an insulating layer on the substrate, wherein the insulating layer comprises a first hole; a light-emitting stack on the insulating layer and comprising an active region comprising a top surface, wherein the top surface comprises a first part and a second part; and an opaque layer covering the first part of the top surface and exposing the second part of the top surface, wherein the second part is directly above the first hole.

20 Claims, 16 Drawing Sheets

LIGHT-EMITTING DEVICE AND MANUFACTURING METHOD THEREOF

TECHNICAL FIELD

The present disclosure generally relates to a light-emitting device and a method thereof, more particularly to a light-emitting device comprising an opaque layer.

REFERENCE TO RELATED APPLICATION

This application claims the right of priority based on TW application Serial No. 105114622, filed on May 11, 2016, and on TW application Serial No. 106112918, filed on Apr. 18, 2017, and the content of which is hereby incorporated by references in their entireties.

BACKGROUND

Light-emitting diodes (LEDs) are widely used as solid-state light sources. Compared to conventional incandescent light lamps or fluorescent light tubes, light-emitting diodes have advantages such as lower power consumption and longer lifetime, and therefore they gradually replace the conventional light sources and are applied to various fields such as traffic lights, back light modules, street lighting, and medical equipment.

SUMMARY

The present disclosure provides a light-emitting device. The light-emitting device comprises a substrate; an insulating layer on the substrate, wherein the insulating layer comprises a first hole; a light-emitting stack on the insulating layer and comprising an active region comprising a top surface, wherein the top surface comprises a first part and a second part; and an opaque layer covering the first part of the top surface and exposing the second part of the top surface, wherein the second part is directly above the first hole.

The present disclosure provides a manufacturing method for making a light-emitting device. The method comprises: forming a light-emitting stack comprising an active region, wherein the light-emitting stack comprises a top surface comprising a first part and a second part; forming an insulating layer on the light-emitting stack, wherein the insulating layer comprises a first hole; providing a substrate; bonding the substrate and the light-emitting stack; forming an opaque layer on a side of the light-emitting stack opposite to the substrate; wherein the opaque layer covers the first part of the top surface and exposing the second part of the top surface, wherein the second part of the top surface corresponds to the first hole.

BRIEF DESCRIPTION OF THE DRAWINGS

The foregoing aspects and many of the attendant advantages of this application will become more readily appreciated as the same becomes better understood by reference to the following detailed description, when taken in conjunction with the accompanying drawings, wherein.

DETAILED DESCRIPTION OF THE PREFERRED EMBODIMENTS

Figure 1A:
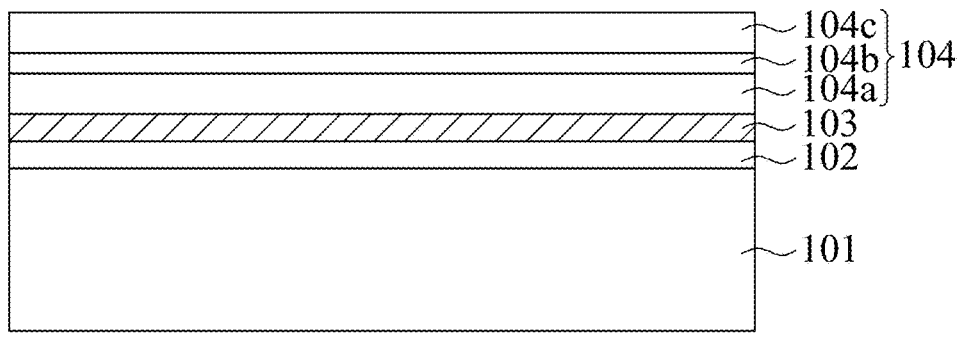
FIG. 1A to FIG. 1T demonstrate a light-emitting device of the first embodiment and the method for manufacturing the light-emitting device of the present disclosure.

Exemplary embodiments of the present application will be described in detail with reference to the accompanying drawings hereafter. The following embodiments are given by way of illustration to help those skilled in the art fully understand the spirit of the present application. Hence, it should be noted that the present application is not limited to the embodiments herein and can be realized by various forms. Further, the drawings are not precisely scaled and components may be exaggerated in view of width, height, length, etc. Herein, the similar or identical reference numerals will denote the similar or identical components throughout the drawings.

Figure 1B:
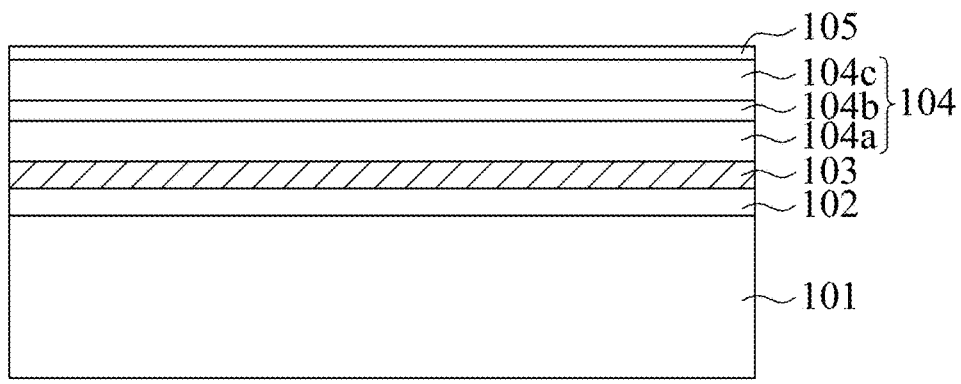
Figure 1C:
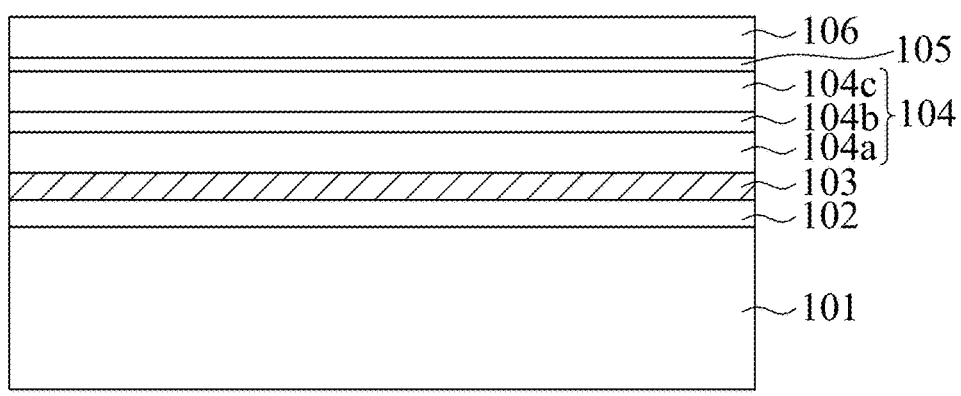
Figure 1D:
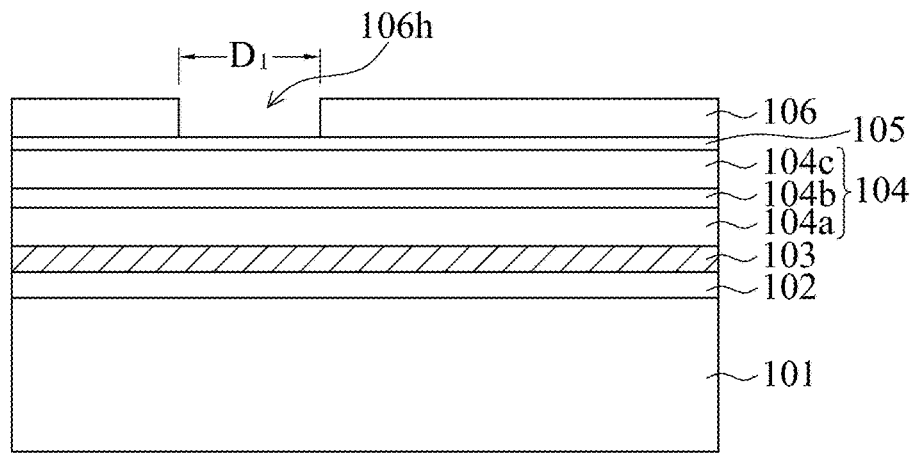
Figure 1E:
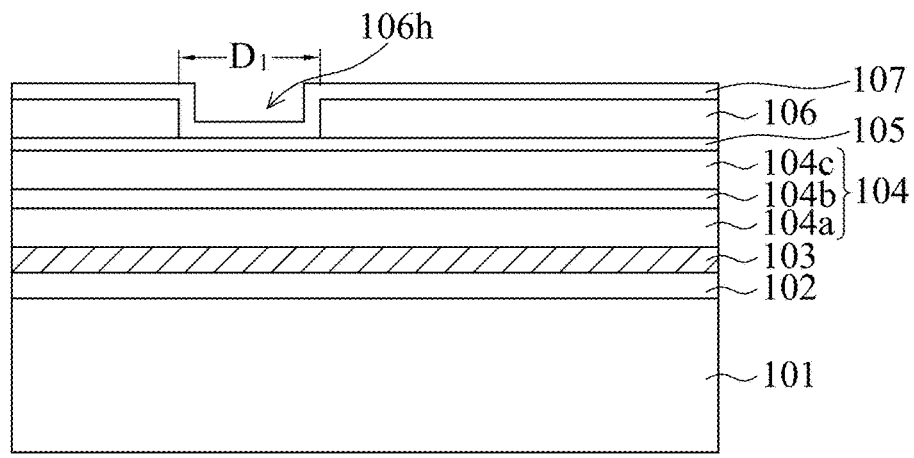
Figure 1F:
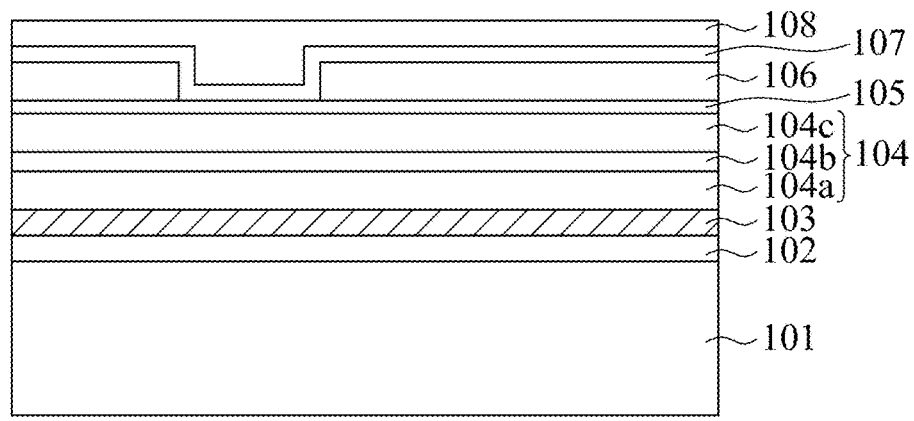
Figure 1G:
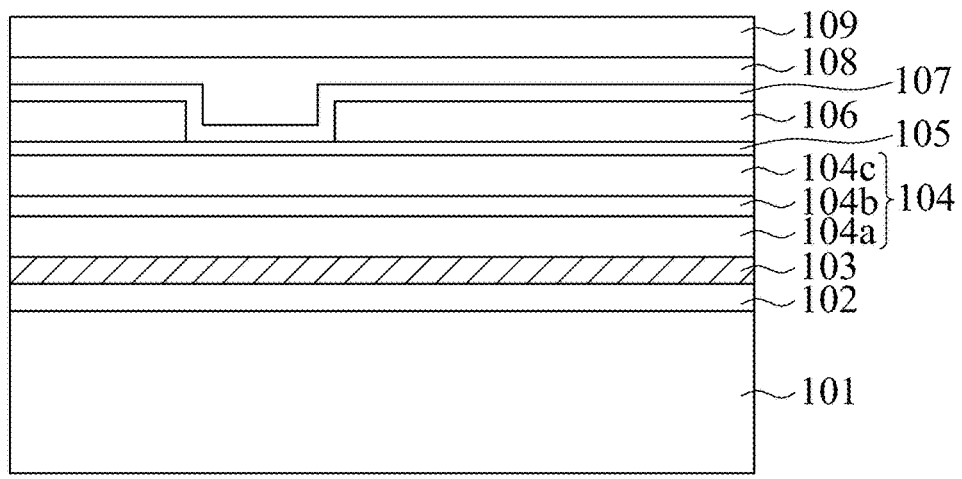
Figure 1H:
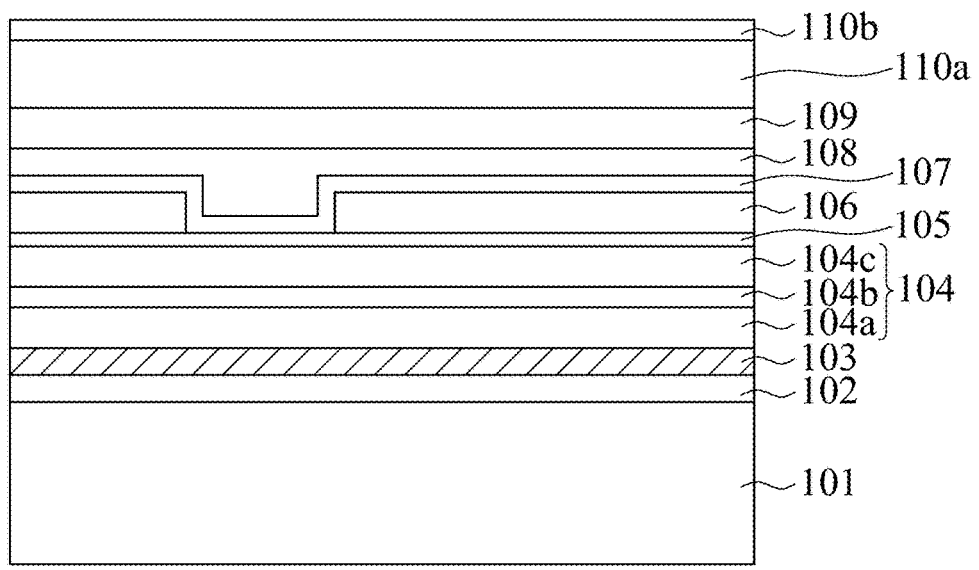
Figure 1I:
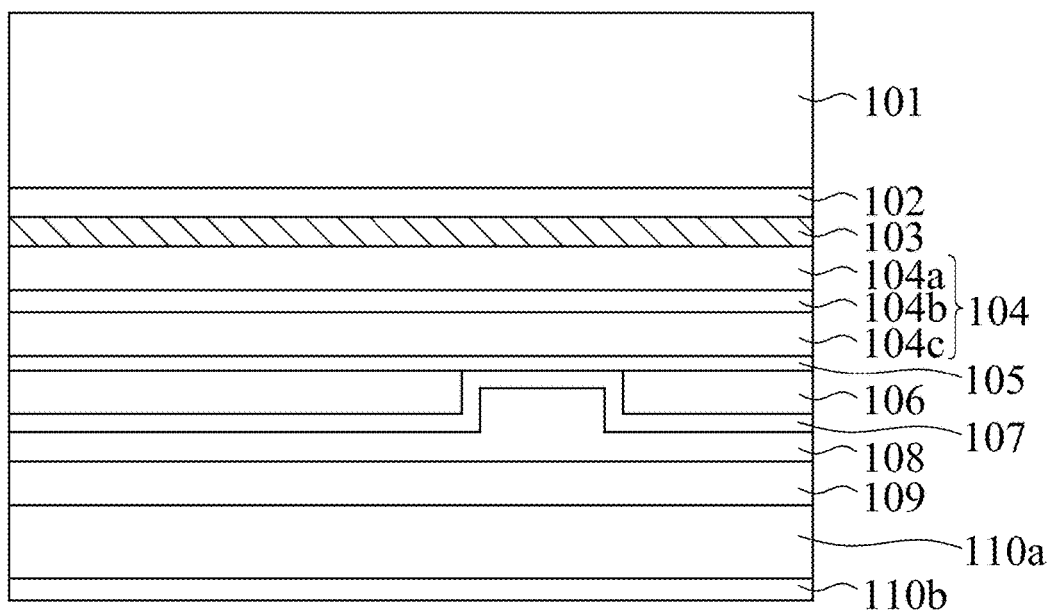
Figure 1J:
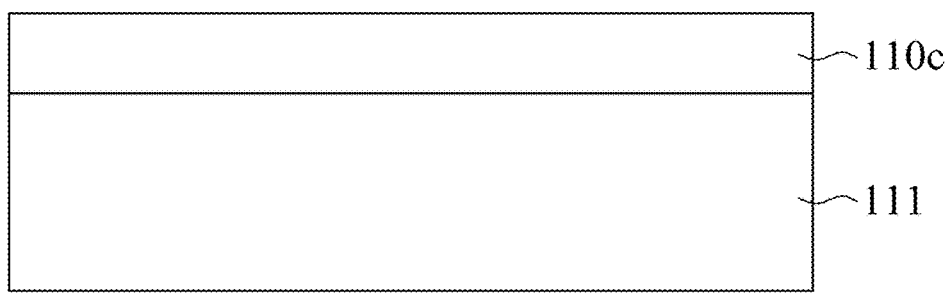
Figure 1K:
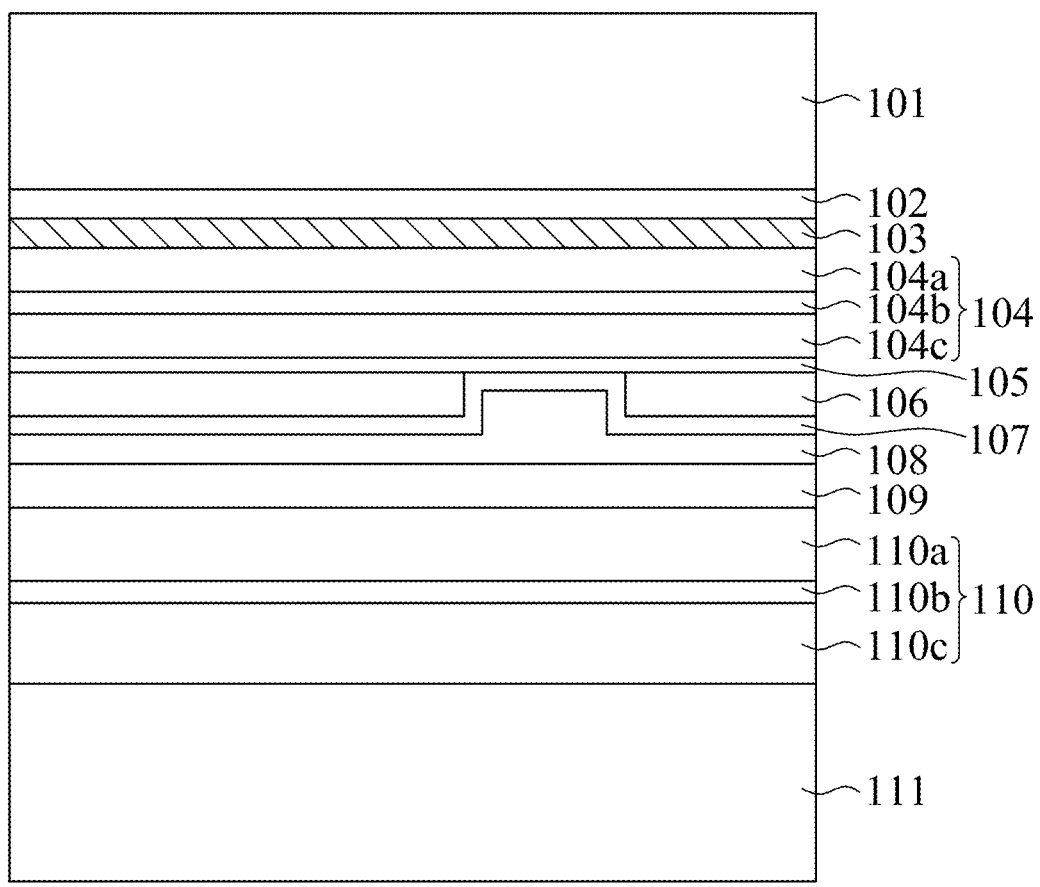
Figure 1L:
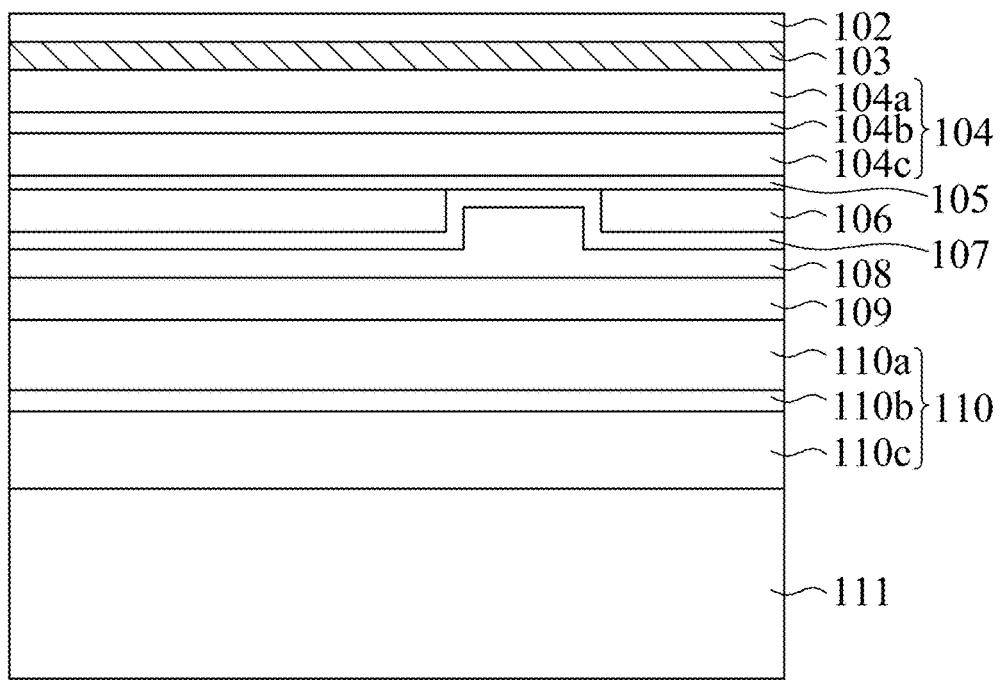
Figure 1M:
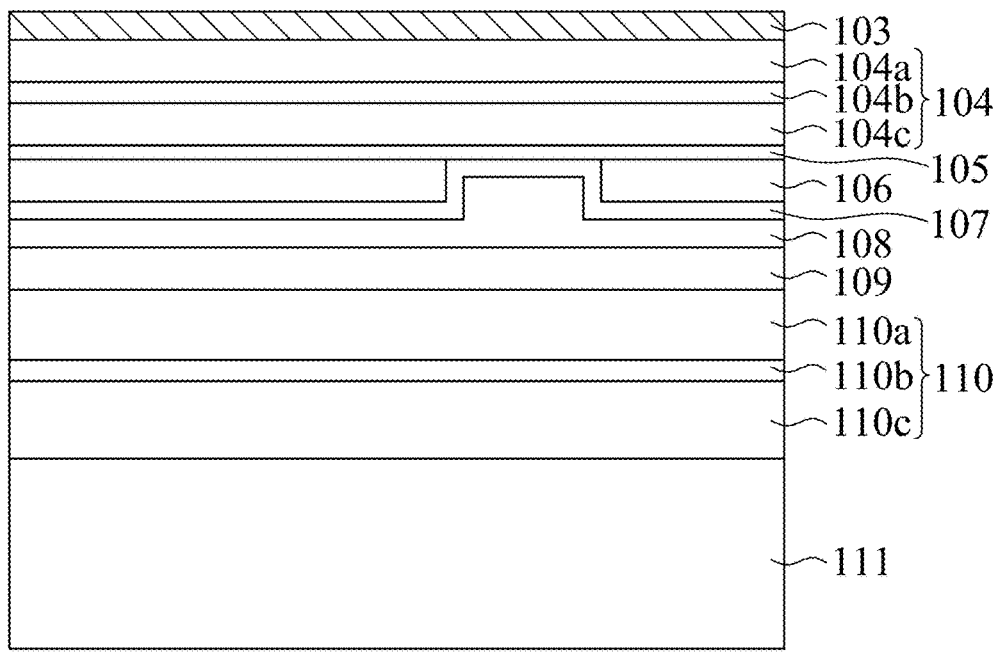
Figure 1N:
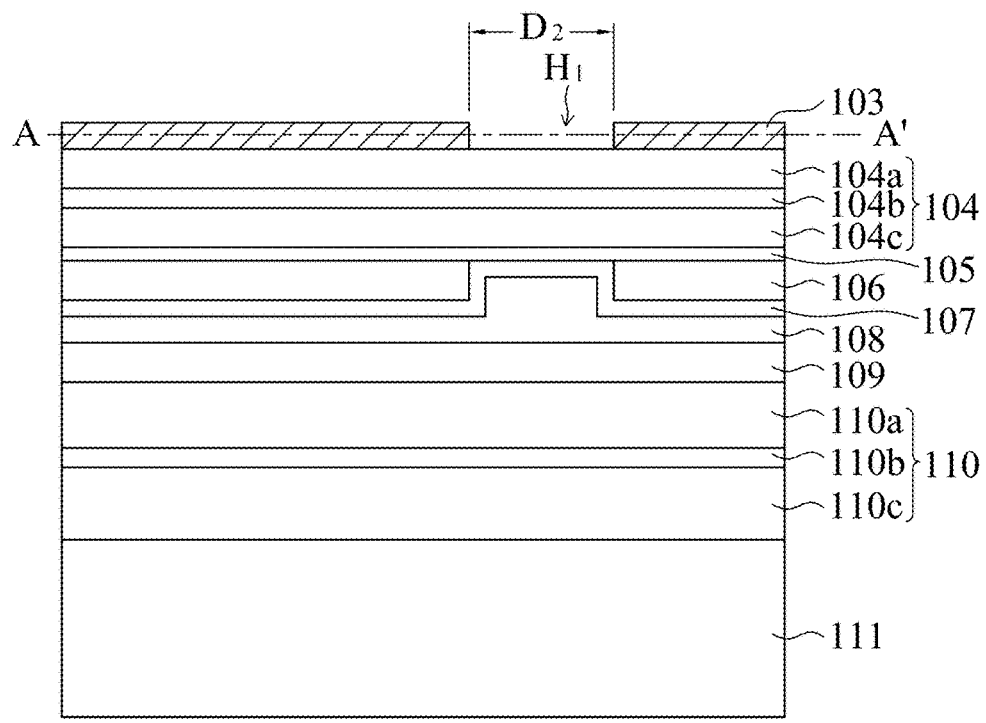
Figure 1O:
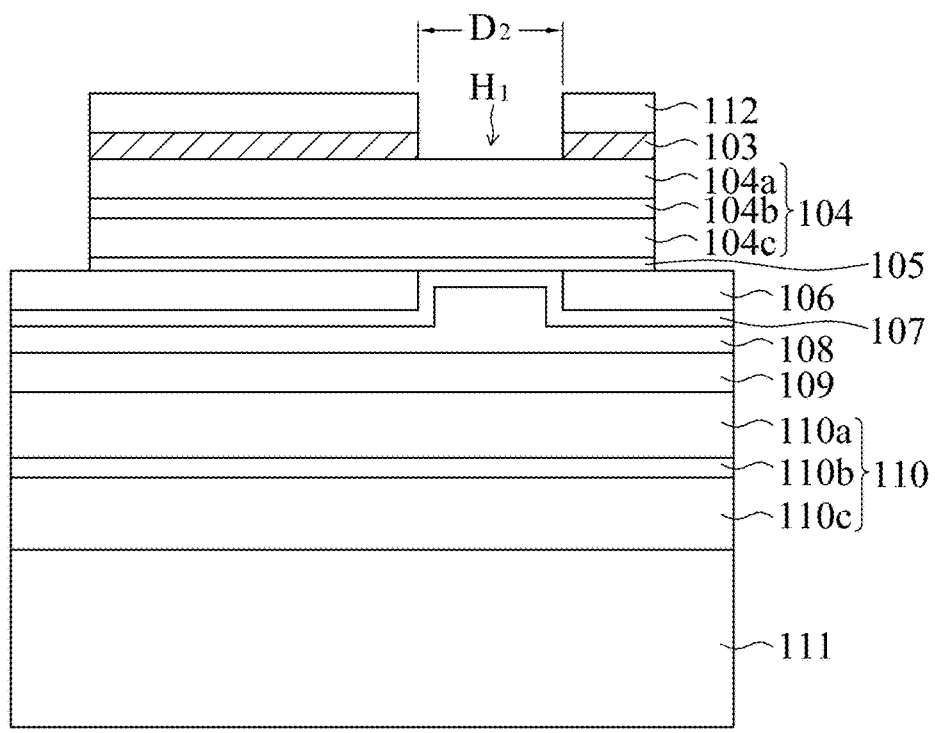
Figure 1P:
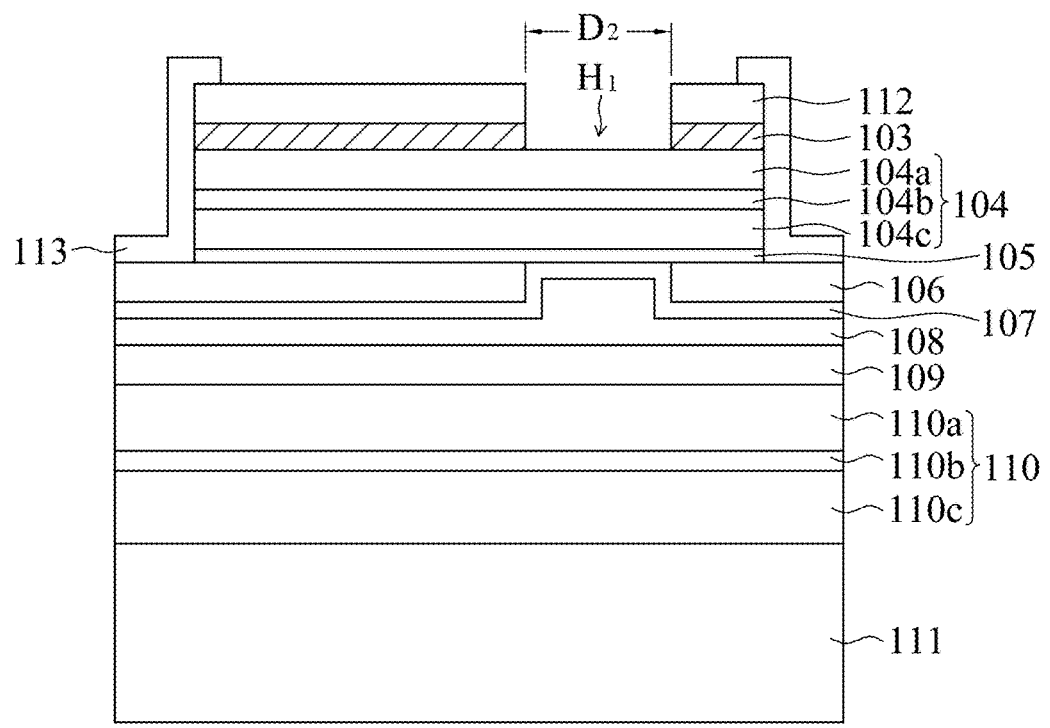
Figure 1Q:
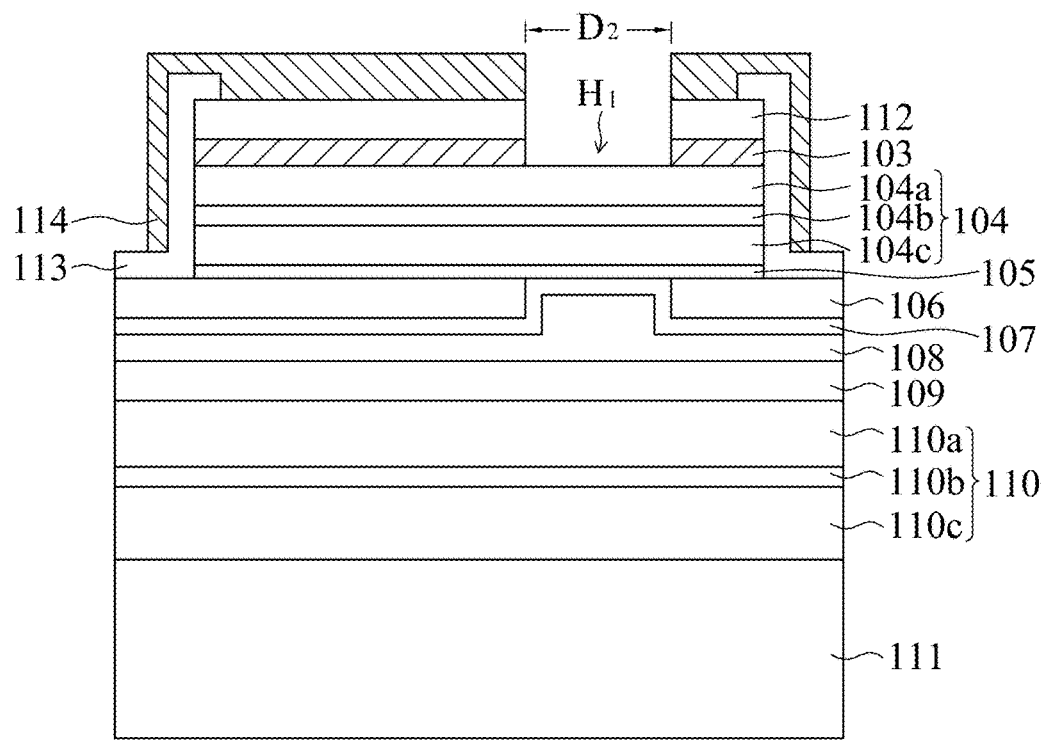
Figure 1R:
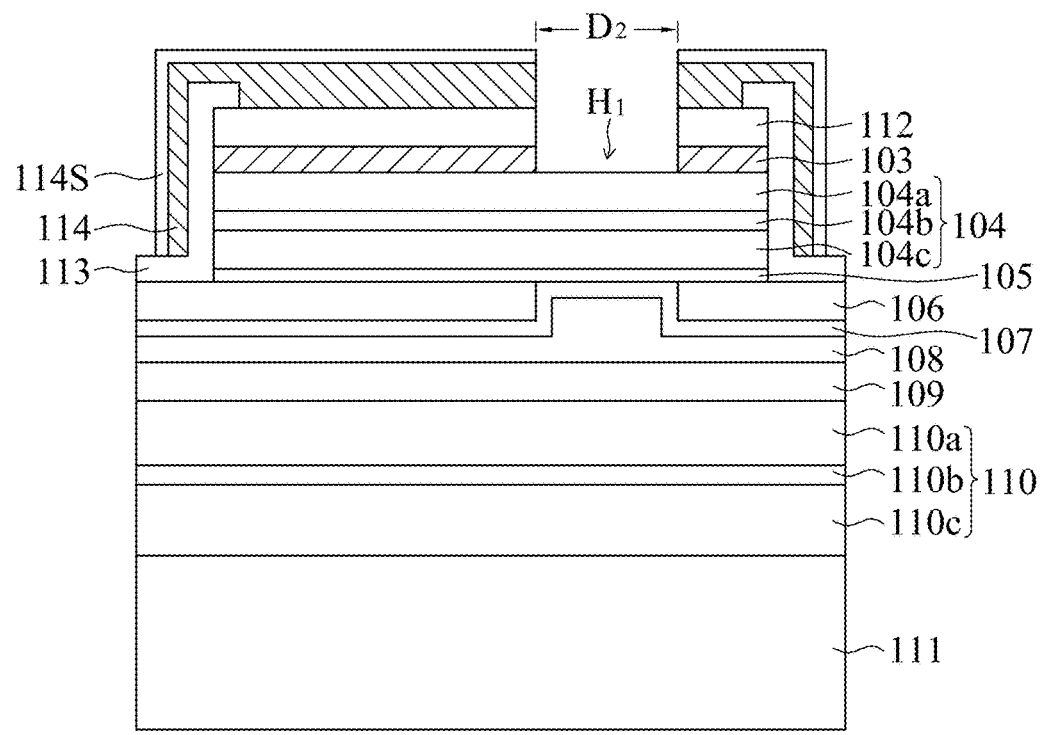
Figure 1S:
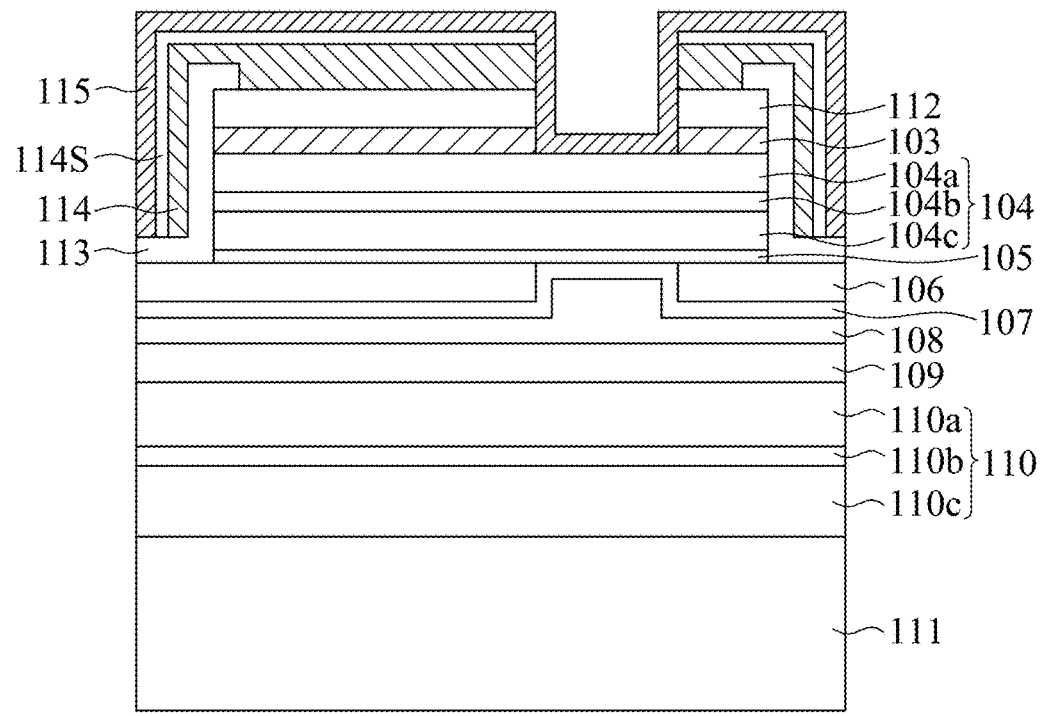
Figure 1T:
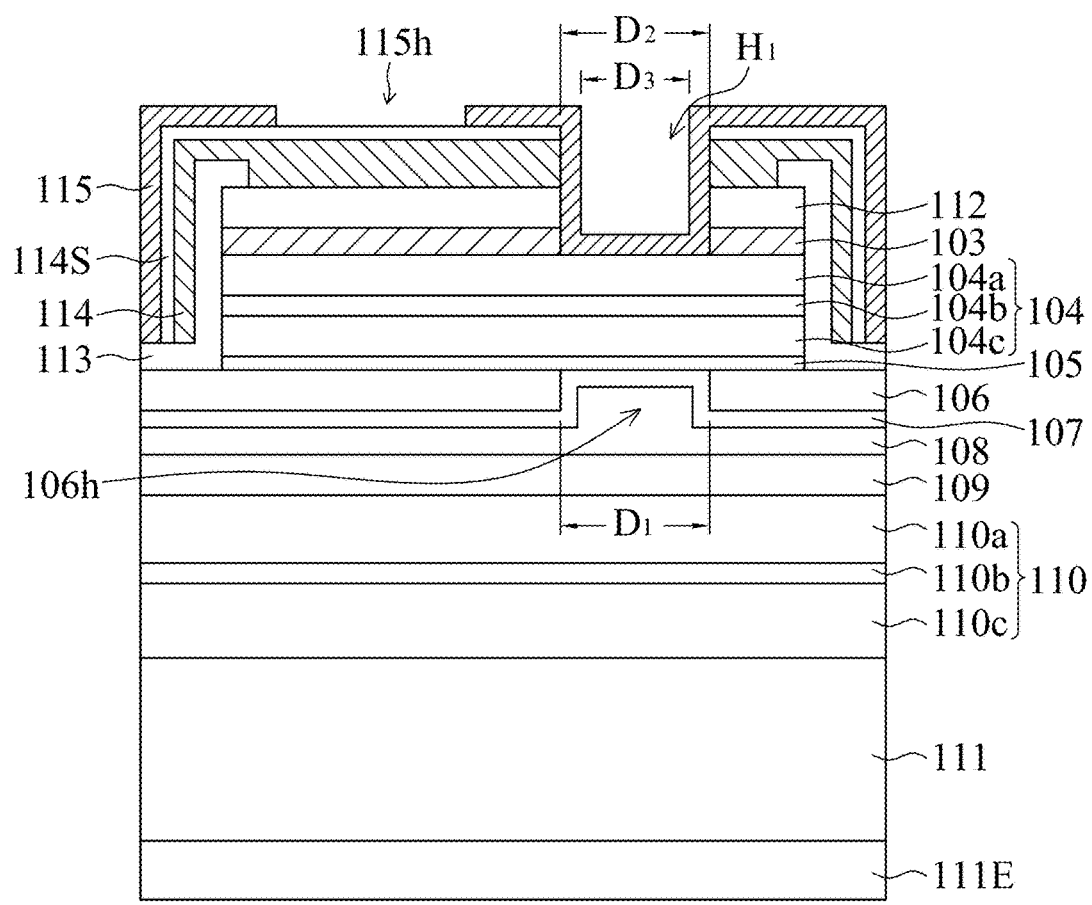

FIG. 1A to FIG. 1T demonstrate light-emitting device of the first embodiment the method for manufacturing the light-emitting device of the present disclosure. First, as shown in FIG. 1A, a growth substrate 101, such as gallium arsenide (GaAs), is provided. A buffer layer 102, a first contact layer 103, and a light-emitting stack 104 are sequentially formed on the growth substrate 101. During a step of removing the growth substrate 101, which will be described later, the buffer layer 102 is less etchable compared to the growth substrate 10. In another embodiment, the buffer layer 102 can stop etching. The material of the buffer layer 102 may be chosen to have different etching rate from the etching rate of the material of the growth substrate 101 depending on the etching method such as wet etching. For example, when the growth substrate 101 is a GaAs substrate, the buffer layer 102 may comprise InGaP or AlGaAs. In another embodiment, the buffer layer 102 may not be provided if a difference between the etching rate of the growth substrate 101 and the etching rate of the first contact layer 103 to a same etchant is obvious, for example, the etching rate of the growth substrate 101 is greater than the etching rate of the first contact layer 103 by at least 2 orders or vice versa. The first contact layer 103 may provide a low resistivity contact, for example, less than $10^{-3}$ Ωcm. The first contact layer 103 comprises n-type GaAs, and the doping concentration is greater than $1 \times 10^{18}/cm^3$.

The light-emitting stack 104 comprises a first type semiconductor layer 104a, a second type semiconductor layer 104c, and an active region 104b between the first type semiconductor layer 104a and the second type semiconductor layer 104c. The conductivity type of the first type semiconductor layer 104a is different from the conductivity type of the second type semiconductor layer 104c. For example, the first type semiconductor layer 104a is an n-type semiconductor layer, and the second type semiconductor layer 104c is a p-type semiconductor layer. The first type semiconductor layer 104a, the active region 104b, and the second type semiconductor layer 104c comprise Group III-V material, for example, $Al_yGa_{(1-y)})_{1-x}In_xP$, wherein $0 \leq x \leq 1$, $0 \leq y \leq 1$.

As shown in FIG. 1B, a second contact layer 105 is formed on the light emitting stack 104 for providing a low resistivity contact, such as less than $10^{-3}$ Ωcm. The material of the second contact layer 105 may comprise GaP. In the present embodiment, the thickness of the second contact layer 105 is not more than 1.5 μm, more preferably, between about 0.1 μm and 0.5 μm. As shown in FIG. 1C, an insulating layer 106 is formed on the second contact layer 105. The refractive index of the insulating layer 106 may be smaller than the effective refractive index of the light emitting stack 104. The insulating layer 106 may comprise a material such as $SiO_x$, $MgF_2$ and $SiN_x$. The thickness of the insulating layer 106 is between about 50 nm and about 300 nm, or the thickness of the insulating layer 106 is between about 100 nm and about 200 nm. As shown in FIG. 1D, a first hole 106h is formed in the insulating layer 106 and penetrating the insulating layer 106 by lithography and the etching process. The view of the first hole 106h in the direction from the insulating layer 106 to the light emitting stack 104 is substantially a circle (not shown). The circle has a diameter $D_1$, wherein the diameter $D_1$ is between about 20 μm and about 150 μm, or the diameter $D_1$ is between about 40 μm and 90 μm.

As shown in FIG. 1E, a first transparent conductive layer 107 is formed on the insulating layer 106 and filled in the first hole 106h to electrically connected to the light-emitting stack 104. The amount of current flowing through the light emitting stack 104 can be controlled by adjusting the size of the first hole 106h. As shown in FIG. 1F, a second transparent conductive layer 108 is formed on the first transparent conductive layer 107. The second transparent conductive layer 108 comprises a material different from the material of the first transparent conductive layer 107, or the method of forming the second transparent conductive layer 108 may be different from the method of forming the first transparent conductive layer 107. The second transparent conductive layer 108 may function as a layer for improving lateral current spreading (i.e., in a direction perpendicular to the stacking direction of each layer) or may be a layer transparent to the light emitted from the light-emitting stack 104. If the second transparent conductive layer 108 functions as a layer transparent to the light emitted from the light-emitting stack 104, the second transparent conductive layer 108 comprises a material having a lower refractive index than the effective refractive index of the light emitting stack 104. If the second transparent conductive layer 108 functions as a layer for improving lateral current spreading, the second transparent conductive layer 108 has a thickness thicker than the thickness of the first transparent conductive layer 107. For example, in a direction from the insulating layer 106 to the second transparent conductive layer 108, the thickness of the transparent conductive layer 107 is between about 25 Å and about 200 Å, or between about 40 Å and 60 Å, and the thickness of the second transparent conductive layer 108 is between about 25 Å and 2000 Å, or between 600 Å and 1000 Å. In another embodiment, the second transparent conductive layer 108 may not be formed, but the thickness of the first transparent conductive layer 107 may be thickened to replace the function of the second transparent conductive layer 108. The first transparent conductive layer 107 and the second transparent conductive layer 108 each comprise a material such as indium tin oxide (ITO), aluminum zinc oxide (AZO), cadmium tin oxide, antimony tin oxide, Zinc oxide (ZnO), zinc tin oxide, and indium zinc oxide (IZO). In the present embodiment, the material of the first transparent conductive layer 107 comprises indium tin oxide (ITO) and the material of the second transparent conductive layer 108 comprises indium zinc oxide (IZO). The first transparent conductive layer 107 is formed by electron beam gun (E-gun) and the second transparent conductive layer 108 is formed by sputtering, wherein the density of the transparent conductive layer formed by sputtering is higher than that of the transparent conductive layer formed by electron beam gun (E-gun). That is, the second transparent conductive layer 108 is denser than the first transparent conductive layer 107, thus improving lateral current diffusion.

As shown in FIG. 1G, a reflective layer 109 is formed on the second transparent conductive layer 108 to reflect the light emitted from the light emitting stack 104. In the present embodiment, the reflective layer 109 has a reflectivity greater than 85% to the light emitted from the light emitting stack 104. The reflective layer 109 may comprise metal such as gold (Au) or silver (Ag).

As shown in FIG. 1H, a first bonding layer 110a is formed on the reflective layer 109 and a second bonding layer 110b is formed on the first bonding layer 110a. Next, as shown in FIG. 1J, a permanent substrate 111 is provided, and then a third bonding layer 110c is formed on the permanent substrate 111. The third bonding layer 110c is then bonded to the second bonding layer 110b. FIG. 1I is an inverted structure of the structure shown in FIG. 1H. The structure shown in FIG. 1J is bonded to the structure shown in FIG. 1I. The structure after the bonding step is shown in FIG. 1K. The first bonding layer 110a, the second bonding layer 110b, and the third bonding layer 110c form a bonding structure 110. The bonding structure 110 may comprise a material with low fusion temperature such as having a melting point of less than or equal to 300° C. For example, the material with low fusion temperature may comprise indium (In) or tin (Sn). In the present embodiment, the material of the first bonding layer 110a comprises gold (Au), the material of the second bonding layer 110b comprises indium (In), and the material of the third bonding layer 110c comprises gold (Au). The first bonding layer 110a, the second bonding layer 110b, and the third bonding layer 110c may be alloyed and then bonded into a bonding structure 110 by an eutectic effect at a low temperature, for example, at a temperature of less than or equal to 300° C., wherein the bonding structure 110 comprises an alloy of indium (In) and gold (Au). In another embodiment, the second bonding layer 110b may be formed on the third bonding layer 110c and then bonded to the first bonding layer 110a to form the bonding structure 110. Next, the growth substrate 101 is removed as shown in FIG. 1L. In the present embodiment, the growth substrate 101 is removed by etching method such as wet etching. The etchant solution comprises a solution comprising aqua ammonia ($NH_3 \cdot H_2O$) and hydrogen peroxide ($H_2O_2$). Because the buffer layer 102 comprises $In_xGa_{1-x}P$, wherein $0 \leq x \leq 1$, which is more difficult to be etched compared to the growth substrate 101, the problem of damaging the light-emitting stack 104 during the step of removing the growth substrate 101 can be avoided or alleviated. Next, since the buffer layer 102 comprises $In_xGa_{1-x}P$, wherein $0 \leq x \leq 1$, which may absorb the light emitted from the light-emitting stack 104, the buffer layer 102 may be further removed, as shown in FIG. 1M.

Next, as shown in FIG. 1N, a second hole $H_1$ is formed in the first contact layer 103 to penetrate the first contact layer 103. The view of the second hole $H_1$ in the direction from the contact layer 103 to the permanent substrate 111 is substantially a circle (not shown). The circle has a diameter $D_2$, wherein the diameter $D_2$ is between about 20 µm and about 150 µm, or the diameter $D_2$ is between about 40 µm and 90 µm. Specifically, the second hole $H_1$ has a cross-sectional area along an A-A' line, which is perpendicular to the stacking direction of the light-emitting stack 104. In the present embodiment, the second hole $H_1$ is formed by lithography and the etching process. As shown in FIG. 1O, an upper contact layer 112 is formed on the first contact layer 103. After forming the upper contact layer 112, the part of the upper contact layer 112 directly above the second hole $H_1$ is removed such that the second hole $H_1$ extends and penetrates through the upper contact layer 112. In the present embodiment, the upper contact layer 112 comprises an alloy such as an alloy of germanium (Ge), gold (Au), and nickel (Ni). As shown in FIG. 1O, a periphery part of the upper contact layer 112, a periphery part of the light-emitting stack 104, a periphery part of the first contact layer 103, and a periphery part of the second contact layer 105 are removed by lithography and the etching process to expose a part of the insulating layer 106. Next, as shown in FIG. 1P, a sidewall insulating layer 113 is formed on the sidewall formed after removing a periphery part as mentioned previously. The sidewall insulating layer 113 comprises an insulative material. In the present embodiment, the sidewall insulating layer 113 comprises a stack comprising a layer comprising silicon nitride ($Si_3N_4$) and a layer comprising silicon oxide ($SiO_2$). The sidewall insulating layer 113 is formed by firstly forming a stack comprising the layer comprising silicon nitride ($Si_3N_4$) and the layer comprising silicon oxide ($SiO_2$), and then a part of the stack on the light-emitting stack 104 is removed by lithography and the etching process. As a result, the other part of the stack remained on the sidewall is the sidewall insulating layer 113. As shown in FIG. 1P, in the present embodiment, the sidewall insulating layer 113 is also formed on the exposed insulating layer 106 and on a part of the upper contact layer 112.

Next, as shown in FIG. 1Q, an upper electrode 114 is formed on the structure as shown in FIG. 1P. The material of the upper electrode 114 comprises metal. In the present embodiment, the upper electrode 114 comprises a stack comprising a layer comprising titanium (Ti) and a layer comprising platinum (Pt), wherein the stack is formed by E-beam evaporation method. In another embodiment, the upper electrode 114 is devoid of Pt and is substantially composed of Ti. In another embodiment, the upper electrode 114 comprises Ti and Au. After forming the stack, the part of the stack substantially directly above the second hole $H_1$ is removed such that the second hole $H_1$ extends and penetrates through the upper electrode 114. In the present embodiment, the upper electrode 114 not only functions as an electrode, but also functions as an opaque layer to cover a part of the light emitting stack 104. The upper electrode 114 is on the light emitting stack 104 and the second hole $H_1$ penetrates the upper electrode 114 such that the light emitted from the light emitting stack 104 can escape from the second hole $H_1$. That is, the area not covered by the upper electrode 114 is a main light exit region of the light-emitting device. Besides, the upper electrode 114 covers the light emitting stack 104 other than the part of the light emitting stack 104 right under the second hole $H_1$. Furthermore, the upper electrode 114, which is an opaque layer, covers a sidewall of the light emitting stack 104. As a result, the sidewall insulating layer 113 is between the upper electrode 114 and the sidewall of the light emitting stack 104 so as to insulate the upper electrode 114 from the light emitting stack 104. In the present embodiment, the light emitted from the light emitting stack 104 escapes from the second hole $H_1$, which functions as a light-extraction hole In the present embodiment, the size, shape and position of the second hole $H_1$ are firstly determined, and the size, shape, and position of the first hole 106h then corresponds to those of the second hole H1. Accordingly, the size and the shape of the second hole $H_1$ can be substantially the same as those of the first hole 106h, and the first hole 106h is directly under the second hole $H_1$.

In addition, since the material of the upper electrode 114 is not prone to form on the sidewall insulating layer 113, the thickness of the upper electrode 114 on the sidewall insulating layer 113 may be too thin. To address this problem, in another embodiment, as shown in FIG. 1R, a metal layer 114S is formed to cover the upper electrode 114 so as to increase a total thickness of the upper electrode 114 and the metal layer 114S on the sidewall insulating layer 113. The metal layer 114S may be formed on the upper electrode 114 by electroless plating method, for example, by immersing the structure as shown in FIG. 1Q in a solution comprising metal, such as Au, Ti, Pt, Ag. In the present embodiment, the solution comprises Au. After reduction-oxidation reaction, a gold layer is formed. Next, the part of the gold layer corresponding to the second hole $H_1$ is removed such that the second hole $H_1$ extends and penetrates through the metal layer 114S. In another embodiment, to function as an opaque layer covering the light-emitting stack 104, the thickness of the upper electrode 114 is at least greater than 100 Å. In the present embodiment, the thickness of the Ti layer is between about 200 Å and 400 Å. The thickness of the Pt layer is between about 2 µm and 4 µm. The thickness of Au layer is between about 2000 Å and 4000 Å.

Next, as shown in FIG. 1S, a protective layer 115 is conformably formed on the structure as shown in FIG. 1R. After the protective layer 115 is conformably formed on the inside wall surrounding the second hole $H_1$, the diameter of a hole (not labeled) surrounded by the protective layer 115 is $D_3$. The material of the protective layer 115 is an insulative material such as silicon nitride ($Si_3N_4$) or silicon oxide ($SiO_2$). As shown in FIG. 1T, a part of the protective layer 115 is removed to form a third hole 115h. The third hole 115h exposes a part of the metal layer 114S for connecting a bonding pad such that an external power supply can provide power via a wire connected to the bonding pad. In another embodiment, if the light-emitting device is devoid of the metal layer 114S, the third hole 115h exposes a part of the upper electrode 114 for connecting a bonding pad. A lower electrode 111E is formed on the permanent substrate 111.

Figure 2:
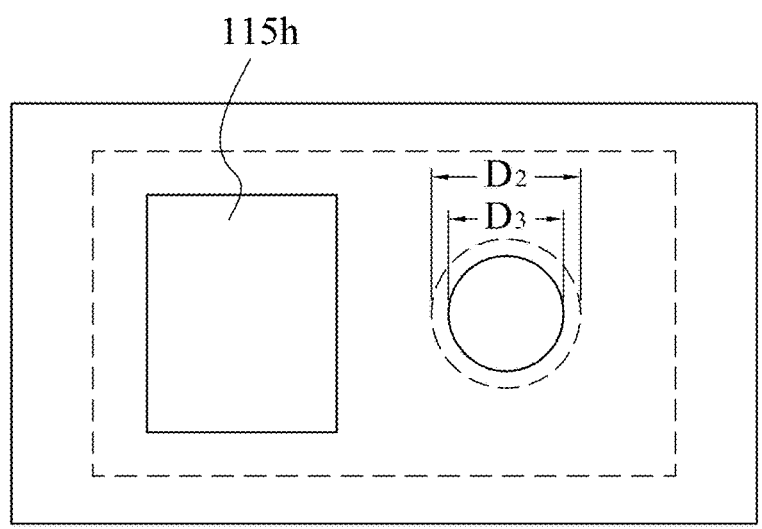
FIG. 2 is a top-view of the light-emitting device of the first embodiment of the present disclosure.

FIG. 1T is cross-sectional view of a finished light-emitting device in accordance of a first embodiment of the present disclosure. FIG. 2 is a top-view of FIG. 1T. Referring to FIG. 1T and FIG. 2, the light-emitting device comprises a permanent substrate 111, a bonding structure 110 on the permanent substrate 111, a reflective layer 109 on the bonding structure 110, an insulating layer 106 on the reflective layer 109, a light-emitting stack 104 on the insulating layer 106, and an upper electrode 114 being an opaque layer on the light-emitting stack 104. The insulating layer 106 has a first hole 106h. The light-emitting stack 104 comprises a top surface, which is presented as a dash rectangular area as shown in FIG. 2. The upper electrode 114 covers a first part of the top surface of the light-emitting stack 104, that is, the first part is the part other than the dotted circle area as shown in FIG. 2, Specifically, the area of the first part of the top surface of the light-emitting stack 104 is larger than the area of the second part of the top surface of the light-emitting stack 104. Specifically, the upper electrode 114 exposes a second part of the top surface (the dotted circle area as shown in FIG. 2) directly under the second hole $H_1$ such that the light emitted from the light-emitting stack 104 can escape from the second part and the second hole $H_1$. As shown in FIG. 1T, the first transparent conductive layer 107 is filled in the first hole 106h and directly contacts the second contact layer 105 to be electrically connected to the light-emitting stack 104 through the first hole 106h and the second contact layer 105. The part of the first transparent conductive layer 107 in the first hole 106h and directly contacts the second contact layer 105 is a current-conducting area, which is directly under the second hole $H_1$ and the second part of the top surface of the light-emitting stack 104. The current can flow into the light emitting stack 104 through current-conducting area. Specifically, the contact resistance between the first transparent conductive layer 107 and the second contact layer 105 is less than the contact resistance between the insulating layer 106 and the second contact layer 105 by, for example, at least 2 orders or 5 orders. Preferably, the contact resistance between the first transparent conductive layer 107 and the second contact layer 105 is between $10^{-3}$ and $10^{-5}$ $\Omega cm^2$. The insulating layer 106, which is an area incapable of conducting current, surrounds the current-conducting area. The ratio of the cross-sectional area of the second hole $H_1$ to the area of the top surface of the light-emitting stack 104 is between about 1.5% and 5%. As shown in FIG. 2, a bonding pad is formed on the first part of the top surface of the light-emitting stack 104, which is covered by the upper electrode 114. Specifically, the bonding pad is formed in the third hole 115h to electrically connect to the light-emitting stack 104. The shape of the bonding pad and the shape of the third hole 115h may be rectangular or square. The shorter side of the rectangle or any side of the square is at least about 80 μm. As mentioned above, the size and the shape of the first holes 106h in the insulating layer 106 are substantially the same as that of the second hole H1, so the ratio of the cross-sectional area of the first holes 106h to the area of the upper surface is also between about 1.5% and 5%.

Figure 3:
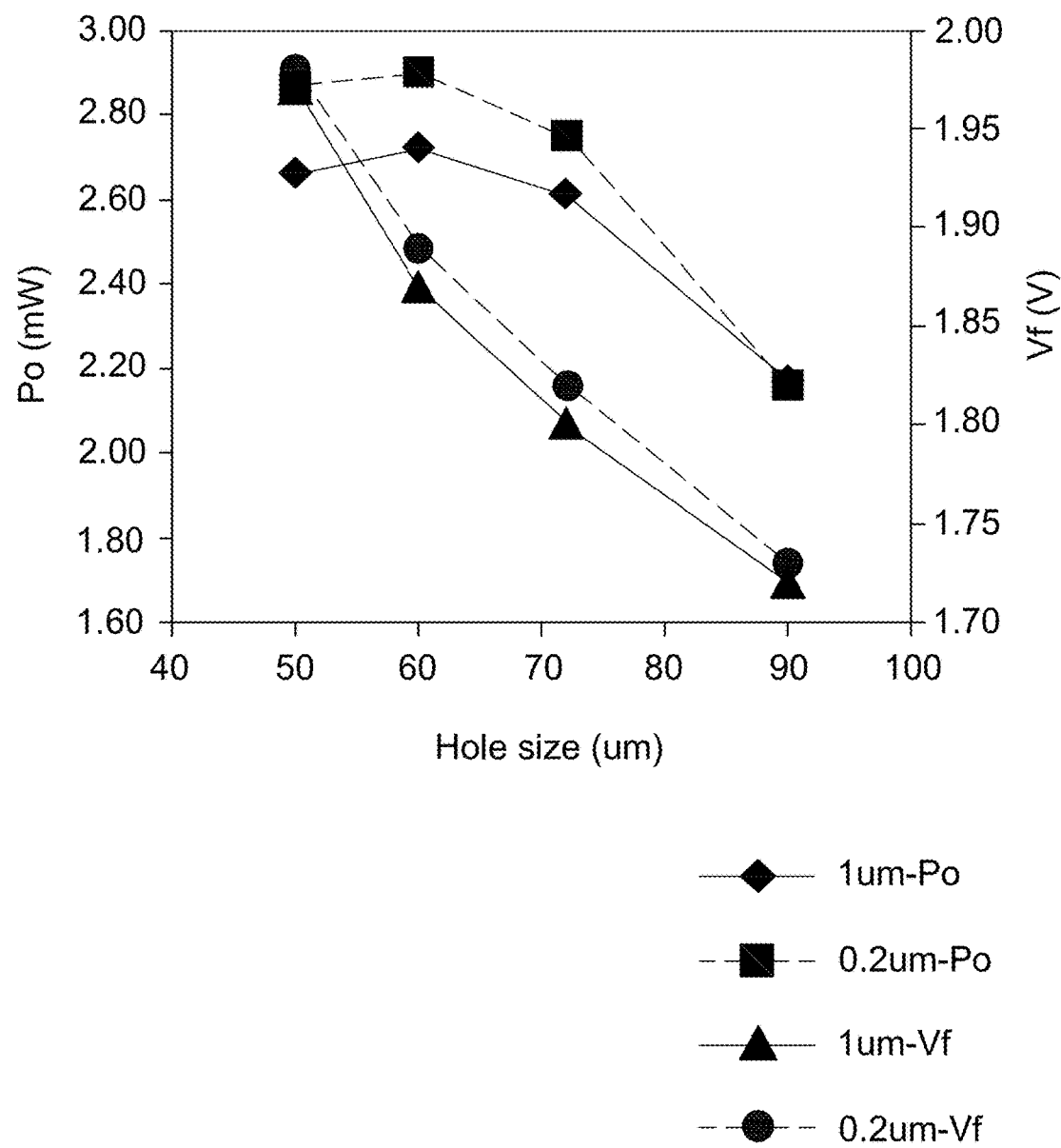
FIG. 3 shows a relationship curve of optical output power (Po, y-axis on the left) vs. the diameter of the hole (x-axis) and a relationship curve of forward voltage ($V_f$, y-axis on the right) vs. the diameter of the first hole (x-axis) of the light-emitting devices disclosed in the present disclosure, wherein the points plotted in diamond and triangle show the light-emitting devices comprising the second contact layer with a thickness of 1 μm, and the points plotted in square and circle show the light-emitting devices comprising the second contact layer with a thickness of 0.2 μm.

FIG. 3 shows a relationship curve of optical output power (Po, y-axis on the left) vs. the diameter of the hole (x-axis) and a relationship curve of forward voltage ($V_f$, y-axis on the right) vs. the diameter of the first hole (x-axis) of the light-emitting devices disclosed in the present disclosure, wherein the points plotted in diamond and triangle show the light-emitting devices comprising the second contact layer with a thickness of 1 μm, and the points plotted in square and circle show the light-emitting devices comprising the second contact layer with a thickness of 0.2 μm. As shown in FIG. 3, the power and the forward voltage of the light-emitting device vary with the diameter of the first hole 106h. That is, the power and the forward voltage can be controlled by adjusting the diameter of the first hole 106h. As a result, the diameter of the first hole 106h can be adjusted for different purposes and applications. In the present disclosure, the thickness of the second contact layer 105 is not greater than 1.5 μm. If the thickness of the second contact layer 105 is greater than 1.5 μm, the effect of the current blocking of the insulating layer 106 is not easily changed with the diameter of the first hole 106h. Under this situation, the power and the forward voltage cannot be significantly changed with the diameter of the first hole 106h. As a result, controlling the power and the forward voltage of the light-emitting device by adjusting the diameter of the first hole 106h is less effective.

Figure 4:
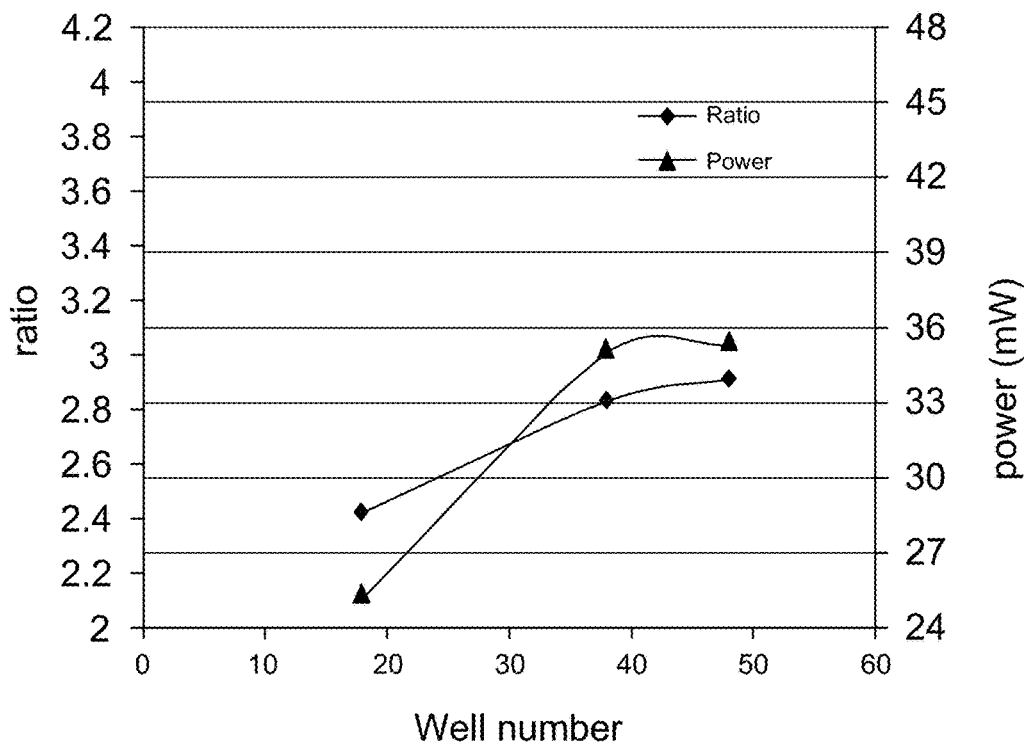
FIG. 4 shows a relationship curve of ratio (y-axis on the left) vs. well number (x-axis) and a relationship curve of power (y-axis on the right) vs. well number (x-axis) of the light-emitting devices disclosed in the present disclosure, wherein the light-emitting devices are operated under the same pulse pattern.

The light-emitting device may be operated normally at a current of 50 mA. However, for different applications, the light-emitting device may be operated at a higher current, such as 300 mA in the present embodiment, and emit light under pulse mode, wherein the pulse mode means that the light emitted from the light-emitting stack 104 is pulsed instead of being constant. The light-emitting device of the present disclosure can be either operated at a current of 50 mA under pulse mode or operated at a current of 300 mA under pulse mode. FIG. 4 shows a relationship curve of ratio (y-axis on the left) vs. well number (x-axis) of the light-emitting devices disclosed in the present disclosure, wherein the light-emitting devices are operated under the same pulse pattern. The active region 104b of the present embodiment comprises a MQW (multi-quantum well) structure comprising alternated well layers and barrier layers. Specifically, the well numbers of the light-emitting devices are 18, 38 and 48 respectively. The ratio is the power of the light-emitting device operated at a current of 300 mA under pulse mode to the power of the light-emitting device operated at a current of 50 mA under pulse mode. FIG. 4 also shows a relationship curve of power (y-axis on the right) vs. well number (x-axis). As shown in FIG. 4, when the light-emitting devices have 38 and 48 wells, the ratios are higher than 2.8. In another embodiment, when the light-emitting device has a well number between 30 and 50 (both inclusive), the ratio is higher than 2.6.

Figure 5:
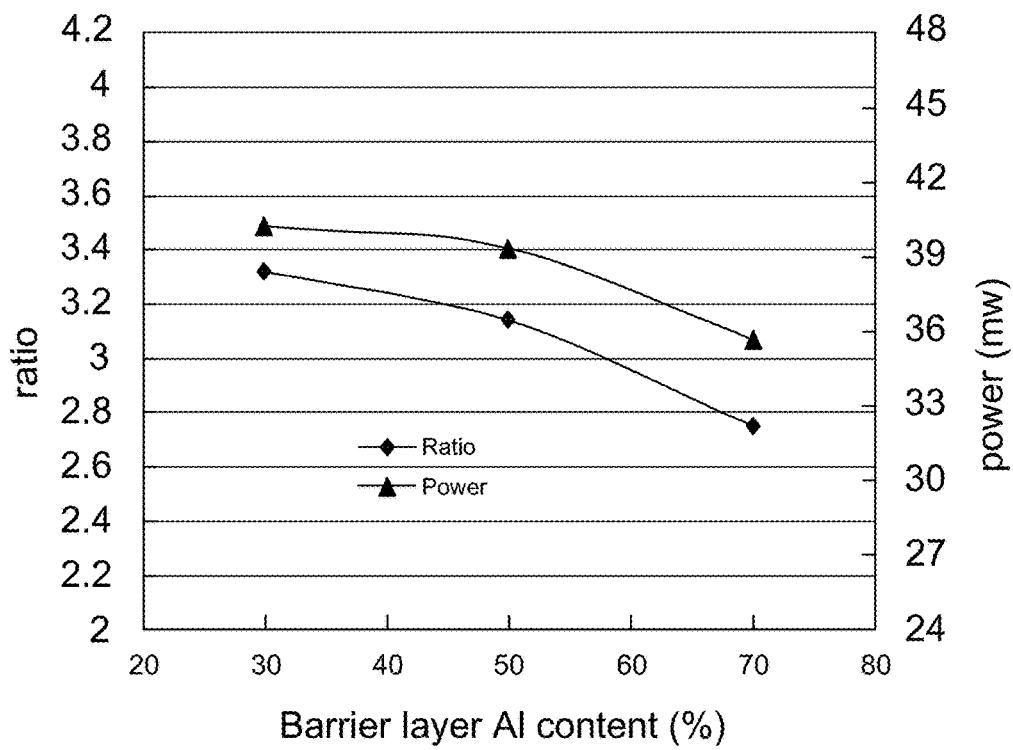
FIG. 5 shows a relationship curve of ratio (y-axis on the left) vs. barrier layer Al content (x-axis) and a relationship curve of power (y-axis on the right) vs. barrier layer Al content (x-axis) of the light-emitting devices of present disclosure, wherein the light-emitting devices are operated under the same pulse pattern.

FIG. 5 shows a relationship curve of ratio (y-axis on the left) vs. Al content of barrier layer (x-axis) of the light-emitting devices of present disclosure, wherein the light-emitting devices are operated under the same pulse pattern. The active region 104b of the present embodiment comprises a MQW structure comprising alternating well layers and barrier layers. The well layers and the barrier layers comprise $(Al_yGa_{(1-y)})_{1-x}In_xP$, where 0≤x<1; 0≤y≤1. In the present embodiments. The values of y of the barrier layers of the light-emitting devices are 0.3, 0.5 and 0.7 respectively. The ratio is the power of the light-emitting device operated at a current of 300 mA under pulse mode to the power of the light-emitting device operated at a current of 50 mA under pulse mode. FIG. 5 also shows a relationship curve of power (y-axis on the right) vs. Al content of the barrier layer (x-axis). As shown in FIG. 5, when the barrier layers of the light-emitting devices comprises $(Al_yGa_{(1-y)})_{1-x}In_xP$ with y of 0.5 and 0.7, the ratios are higher than 3.1. In another embodiment, when the barrier layers of the light-emitting device comprise $(Al_yGa_{(1-y)})_{1-x}In_xP$ with y between 0.4 and 0.6, the ratio and the forward voltage of the light-emitting device are both satisfied. In another embodiment, two of the barrier layers in the multiple barrier layers comprise different Al contents. Specifically, the Al contents of the two barrier layers closer to the first type semiconductor layer 104a are lower than the Al contents of the two barrier layers farther from the first type semiconductor layer 104a. Preferably, the Al contents of at least half of the multiple barrier layers that are closer to the first type semiconductor layer 104a are lower than the Al contents of the other barrier layers that are closer to the second type semiconductor layer 104c. In the present embodiment, the first type semiconductor layer 104a is an n-type semiconductor layer, and the second type semiconductor layer 104c is a p-type semiconductor layer. Specifically, the barrier layers closer to the first type semiconductor layer 104a comprise $(Al_aGa_{1-a})_{1-b}In_bP$, and the barrier layers closer to the second type semiconductor layer 104c comprise $(Al_cGa_{1-c})_{1-d}In_dP$, wherein b is substantially the same as d, and c>a. In another embodiment, the MQW comprise 38 barrier layers, the first 20 barrier layer closer to the first type semiconductor layer 104a comprise $(Al_{0.5}Ga_{0.5})_{1-b}In_bP$, and the remaining 18 barrier layer that are closer to the second type semiconductor layer 104c comprise $(Al_{0.7}Ga_{0.3})_{1-d}In_dP$. In the present embodiment, b is substantially the same as d, and b and d are preferably, but not limited to about 0.5. In another embodiment, the MQW comprise 38 barrier layers, the first 28 barrier layer closer to the first type semiconductor layer 104a comprise $(Al_{0.5}Ga_{0.5})_{1-b}In_bP$, and the remaining 10 barrier layer that are closer to the second type semiconductor layer 104c comprise $(Al_{0.7}Ga_{0.3})_{1-d}In_dP$. In the present embodiment, the b is substantially the same as d while b and d are preferably, but not limited to about 0.5. In another embodiment, the MQW comprise 38 barrier layers, the first 36 barrier layer closer to the first type semiconductor layer 104a comprise $(Al_{0.5}Ga_{0.5})_{1-b}In_bP$, and the remaining 2 barrier layers that are closer to the second type semiconductor layer 104c comprise $(Al_{0.7}Ga_{0.3})_{1-d}In_dP$. In the present embodiment, the b is substantially the same as d while b and d are preferably, but not limited to about 0.5. In another embodiment, the Al contents of some of the consecutive barrier layers are gradually increased in a direction from n-type semiconductor layer to p-type semiconductor layer, that is, from first type semiconductor layer 104a to second type semiconductor layer 104c in the present embodiment. Specifically, every two consecutive barrier layers in the multiple barrier layers, the Al content of the barrier layer that is closer to the first type semiconductor layer 104a is lower than the barrier layer that is closer to the second type semiconductor layer 104c. In another embodiment, the second type semiconductor layer 104c comprises a dopant comprising C, Mg, or Zn. Preferably, the dopant comprises Mg. By having the Al content of the barrier layer closer to the n-type type semiconductor layer being lower than the than the Al content of the barrier layer farther from the n-type type semiconductor layer, the problem of the dopant in the p-type type semiconductor layer diffusing into the active region 104b can be avoided or alleviated. Accordingly, the reliability of the light-emitting device is improved without increasing the forward voltage of the light-emitting device significantly.

Figure 6:
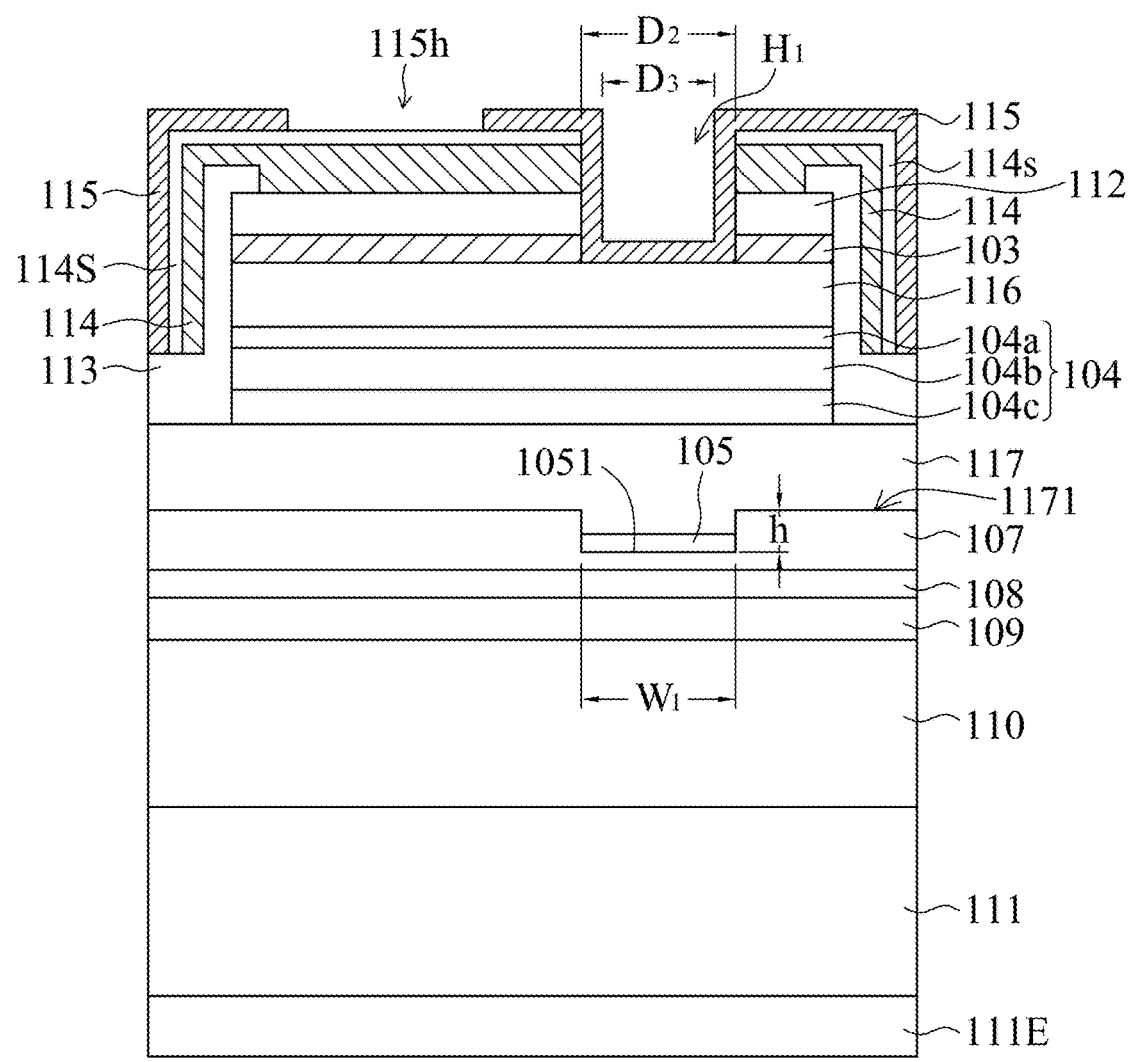
FIG. 6 is a cross-sectional view of the light-emitting device disclosed in the second embodiment of the present disclosure.

FIG. 6 is a cross-sectional view of the second embodiment of the light-emitting device. The light-emitting device in accordance with the second embodiment of the present disclosure comprises substantially the same structure as the first embodiment, and the difference is described below. The light-emitting device further comprises a first semiconductor layer 116 and a second semiconductor layer 117 for increasing the light extraction and/or improving the current spreading through the light emitting stack 104. The first semiconductor layer 116 is between the first contact layer 103 and the light-emitting stack 104, and the second semiconductor layer 117 is between the second contact layer 105 and the light-emitting stack 104. The thickness of the first semiconductor layer 116 is greater than the thickness of the first type semiconductor layer 104a. Preferably, the thickness of the first semiconductor layer 116 is greater than 2000 nm, and more preferably, between 2500 nm and 7000 nm (both inclusive). The second semiconductor layer 117 has a thickness greater than the thickness of the second type semiconductor layer 104c. Preferably, the thickness of the second semiconductor layer 117 is greater than 1000 nm, and more preferably, between 1500 nm and 2000 nm (both inclusive). The first semiconductor layer 116 has a band gap less than the band gap of the first type semiconductor layer 104a. The second semiconductor layer 117 has a band gap less than the band gap of the second type semiconductor layer 104c. The band gap of the first semiconductor layer 116 and the band gap of the second semiconductor layer 117 are both greater than the band gaps of the well layers in the active region 104b. The first semiconductor layer 116 is substantially transparent to the light emitted from the active region 104b. Each of the first semiconductor layer 116 and the second semiconductor layer 117 has a doping concentration higher than $1 \times 10^{17}/cm^3$. Preferably, the doping concentration of the first semiconductor layer 116 is less than the doping concentration of the first contact layer 103. The doping concentration of the second semiconductor layer 117 is less than the doping concentration of the second contact layer 105. Preferably, the doping concentration of the first contact layer 103 is at least two times more than the doping concentration of the first semiconductor layer 116. The doping concentration of the second contact layer 105 is at least two times more than the doping concentration of the second semiconductor layer 117. The first semiconductor layer 116, the second semiconductor layer 117, the first contact layer 103, and the second contact layer 105 comprise a Group III-V semiconductor material, such as AlGaAs or AlGaInP. As shown in FIG. 6, the second contact layer 105 has a width $W_1$. The ratio of the width $W_1$ of the second contact layer 105 to the width of the light exit region is not less than 0.5, and more preferably, is not more than 1.1. Specifically, in the same cross-sectional view, the ratio of the width $W_1$ of the second contact layer 105 to the width of the area not covered by the upper electrode 114, that is, the second part of the top surface of the light-emitting stack 104, is not less than 0.5, and more preferably, is not more than 1.1. Preferably, the ratio is not less than 0.55, and is not more than 0.8.

In another embodiment, the ratio of the width $W_1$ of the second contact layer 105 to the diameter $D_2$ of the second hole $H_1$ is not less than 0.55, and is not more than 0.8. In the present embodiment, as shown in FIG. 6, the second contact layer 105 is directly under the light exit region of the light-emitting device, wherein the light exit region is the area not covered by the upper electrode 114. The contact resistance between the first transparent conductive layer 107 and the second contact layer 105 is less than the contact resistance between the first transparent conductive layer 107 and the second semiconductor layer 117 by at least 2 orders or 5 orders. As a result, the second contact layer 105 having a width $W_1$ is a current-conducting area. The current can flow into the light emitting stack 104 through current-conducting area. The current cannot flow or has difficulty to flow into the light emitting stack 104 through the part of the first transparent conductive layer 107 without directly contacting the second contact layer 105 and surrounding the second contact layer 105. In the present embodiment, the second contact layer 105 is directly under the second hole $H_1$. Preferably, the second contact layer 105 does not overlap the upper contact layer 112 and the upper electrode 114 in a stacking direction of the light emitting stack 104. As shown in FIG. 6, in the present embodiment, the thickness of a part of the second semiconductor layer 117 is larger than the thickness of the other part of the second semiconductor layer 117. Specifically, the thicker part of the second semiconductor layer 117 corresponds to the light exit region, which is not covered by the upper electrode 114. In the present embodiment, the thicker part of the second semiconductor layer 117 corresponds to the second hole H1. That is, the thicker part of the second semiconductor layer 117 is directly under the second hole H1. The second contact layer 105 is on the thicker part of the second semiconductor layer 117. Specifically, the thinner part of the second semiconductor layer 117 comprises a surface 1171 farther from the light emitting stack 104, and the second contact layer 105 comprises a surface 1051 farther from the light emitting stack 104. The surface 1051 of the second contact layer 105 is farther from the light emitting stack 104 than the surface 1171 of the thinner part of the second semiconductor layer 117 from the light emitting stack 104. Specifically, the height h between the surface 1051 of the second contact layer 105 and the surface 1171 of the thinner part of the second semiconductor layer 117 is not less than 50 nm, and is not more than 200 nm. In one embodiment, the thickness of the second contact layer 105 is not less than 10 nm, and is not more than 0.5 μm. Preferably the thickness of the second contact layer 105 is not less than 20 nm, and is not more than 0.1 Since the light-emitting device in the present disclosure comprises the second contact layer 105 having a width $W_1$ and the second contact layer 105 being directly under the light exit region, when a current flows through the light emitting stack 104, the current tends to be concentrated in region of the light emitting stack 104 corresponding to the second contact layer 105, thereby greatly increasing the current density. As a result, the luminous efficiency of the light-emitting device is improved.

The method for manufacturing the light-emitting device in accordance of the second embodiment of the present disclosure is substantially the same as that of the first embodiment, and the differences are described below. Before forming the light emitting stack 104, the method further comprises forming a first semiconductor layer 116 on the first contact layer 103. After forming the light emitting stack 104 and before forming the second contact layer 105, the method further comprises forming the second semiconductor layer 117 as described above. After forming the second contact layer 105, the second contact layer 105 is patterned by lithography and the etching process such that the second contact layer 105 has a width $W_1$. The light-emitting device is then finished by forming the first transparent conductive layer 107 and the second transparent conductive layer 108 as mentioned in the first embodiment. Compared to the method for manufacturing the light-emitting device of the first embodiment, the method of the present embodiment is devoid of a step of forming an insulating layer 106 and devoid of a step of forming a first hole 106h in the insulating layer 106 by lithography and the etching process. As a result, the method of the present embodiment is more-cost effective and simpler.

In one embodiment, the light-emitting device is devoid of the second hole $H_1$. The second contact layer 105 having a width $W_1$ is directly under the light exit region of the light-emitting device, wherein the light exit region is the area not covered by the upper electrode 114.

Figure 7:
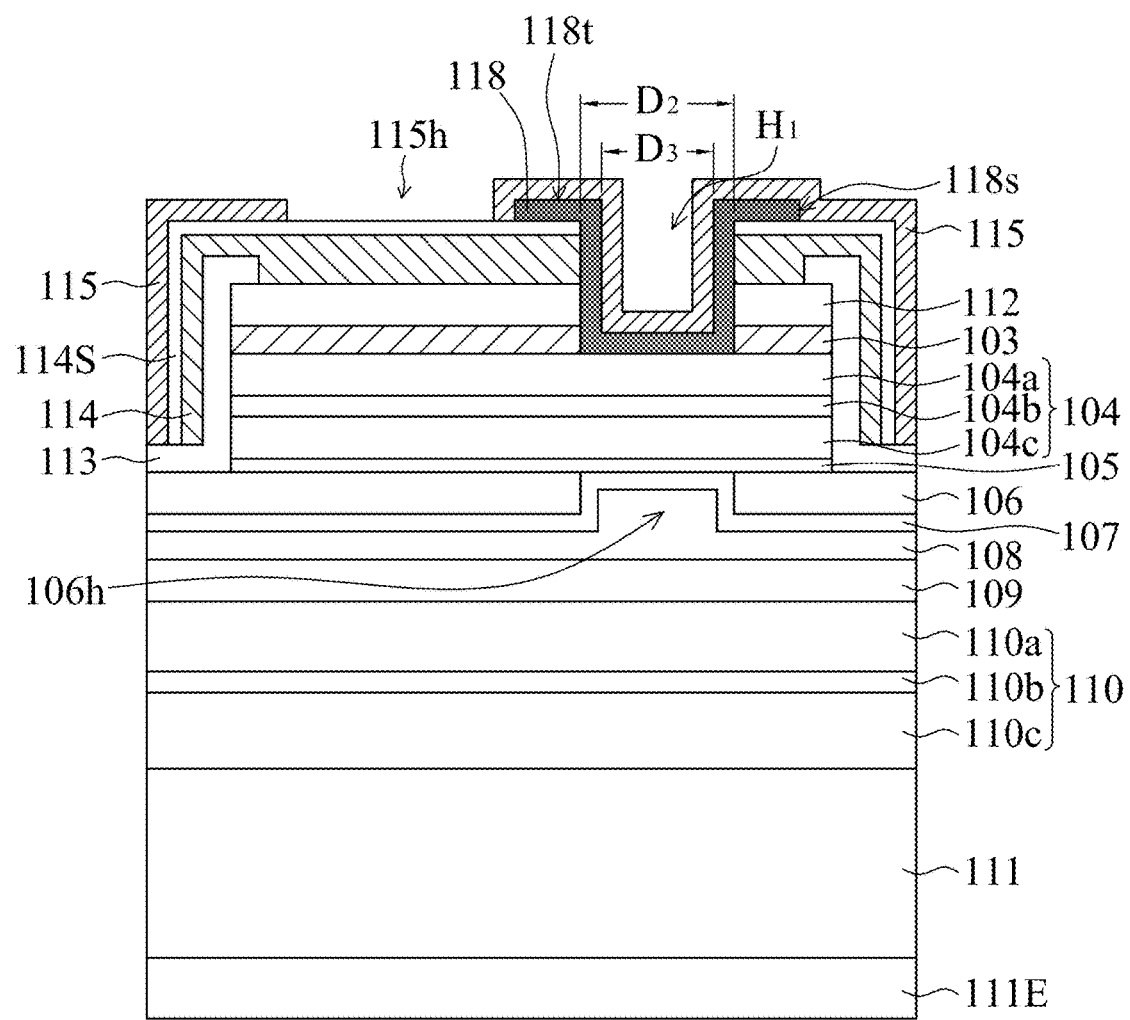
FIG. 7 shows a cross-sectional view of the third embodiment of the light-emitting device.

FIG. 7 shows a cross-sectional view of the third embodiment of the light-emitting device. Comparing to the above embodiments, the light-emitting device shown in the present embodiment further comprises a heat conductive layer 118 on the second part of the top surface of the light-emitting stack 104. Specifically, the heat conductive layer 118 locates on the top surface of the light-emitting stack 104, which is exposed by the second hole $H_1$. The heat conductive layer 118 has a higher thermal conductivity than that of the light-emitting stack 104 in order to dissipate the heat generated by the light-emitting stack 104 through the heat conductive layer 118 via heat conduction or heat radiation. Therefore, the heat gathered in the light-emitting stack 104 under the second hole $H_1$ can be decreased, and the decay of the material in the light-emitting device caused by the heat can be eased up. Furthermore, the life time and the reliability of the light-emitting device are enhanced. The heat conductive layer 118 comprises a material having a thermal conductivity not less than 100 W/(m×K). For example, the material can but not limited to be diamond, graphene, or aluminum nitride ($AlN_x$) with a thermal conductivity between about 140 W/(m×K) and 180 W/(m×K). More specifically, in the present embodiment, the heat conductive layer 118 fills the second hole $H_1$ along the sidewall of the second hole $H_1$, and covers the first type semiconductor layer 104a exposed by the second hole $H_1$. The heat conductive layer 118 further extends away from the second hole $H_1$ and toward the edge of the light-emitting device, and contacts the metal layer 114S or the upper electrode 114 for conducting the heat generated by the light-emitting stack 104 to the metal layer 114S or the upper electrode 114 through the heat conductive layer 118. Since the materials of the metal layer 114S and the upper electrode 114 are usually selected from metal, which usually has high thermal conductivity, the heat in the light-emitting device can be dissipated through the heat conductive layer 118 to the metal layer 114S or upper electrode 114. In some embodiments, the heat conductive layer 118 does not contact the metal layer 114S or the upper electrode 114, and the heat generated from the light-emitting stack 104 can be dissipated via heat radiation. Alternatively, the heat conductive layer 118 can be connected to the outside conductive structure to dissipate the heat generated by the light-emitting stack 104 via heat conductive. Comparing with the first embodiment, the light-emitting device in the present embodiment comprises a protection layer 115 not only covering on the metal layer 114S, but also covering the heat conductive layer 118. In the present embodiment, the protective layer 115 can completely cover the heat conductive layer 18. Particularly, the heat conductive 118 comprises an upper surface 118t parallel with the top surface of the light-emitting stack 104 and a side surface 118s. The side surface 118s connects to the upper surface 118t and is not parallel with the top surface of the light-emitting stack 104. The protective layer 115 can cover the upper surface 118t and the side surface 118s to prevent the material of the heat conductive layer 118 from contacting the outside environment and deteriorating during the operation of the light-emitting device. In another embodiment, the protective layer 115 can be replaced by the heat conductive layer 118 to cover the whole surface of the upper electrode 114 or the whole surface of the metal layer 114S, except for the position on the third hole 115h. Thus, the heat conductive area can be increased. In one embodiment, the heat conductive layer 118 has high transmittance to the light emitted from the light-emitting stack 104, for example, the heat conductive layer 118 comprises a material having a transmittance higher than 85% to the light emitted from the active region 104b. Moreover, in another embodiment, the heat conductive layer 118 comprises a refractive index higher than 1.5, or between 2.1 and 2.5, and a difference between the refractive indexes of the heat conductive layer 118 and the first type semiconductor layer 104a is not more than 1.5 in order to decrease the probability of total reflection incurred on the interface of the heat conductive layer 118 and the first type semiconductor layer 104a. Thus, the light extraction efficiency of the light-emitting device can be enhanced. A thickness of the heat conductive layer 118 can but not limited to be between 300 Å and 2000 Å. In the present embodiment, the thickness of the heat conductive layer 118 is 1000 Å. The heat conductive layer 118 can be formed after the formation of the upper electrode 114 shown in FIG. 1Q, or formed after the formation of the metal layer 114S shown in FIG. 1R for covering the upper electrode 114 or the metal layer 114S.

Figure 8A:
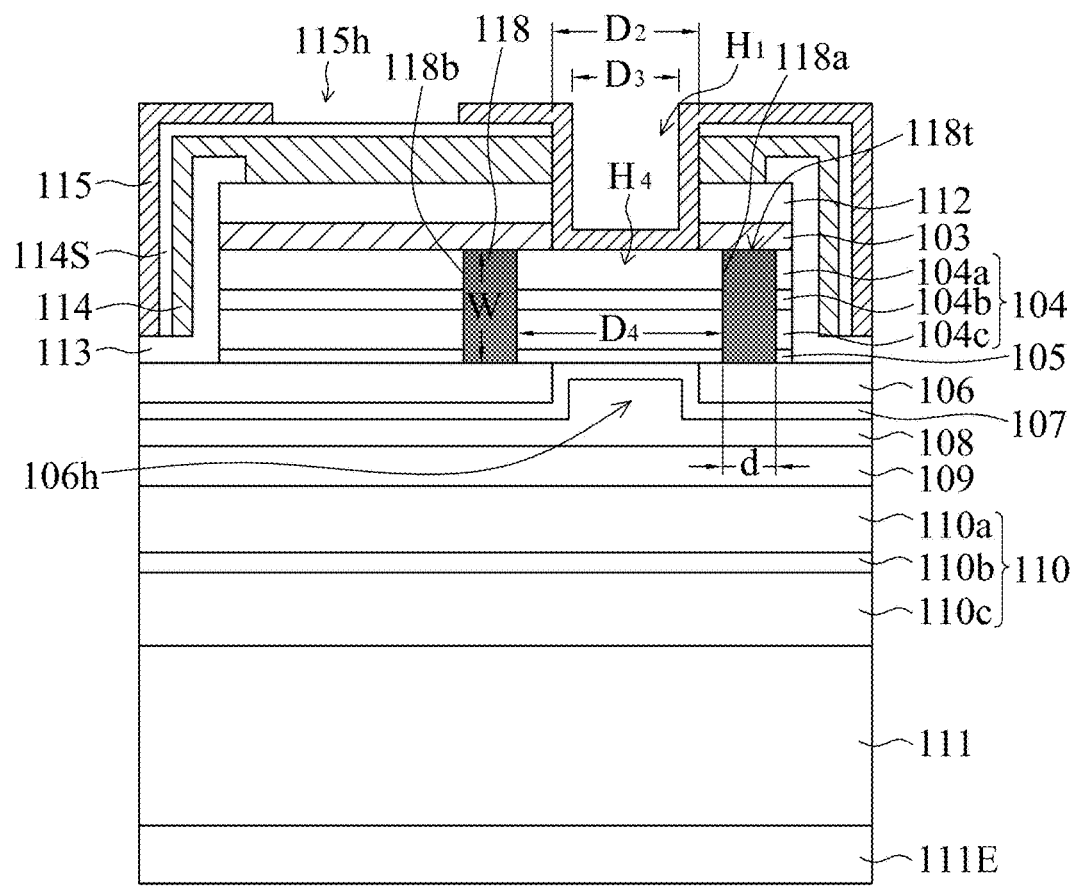
FIGS. 8A-8B show a cross-sectional view and a top view of the fourth embodiment of the light-emitting device respectively.
Figure 8B:
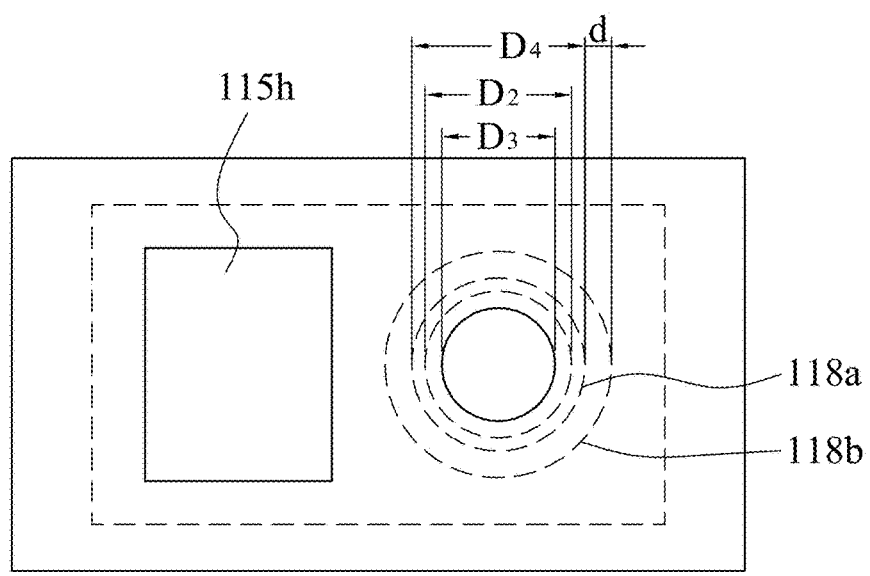

FIGS. 8A-8B show a cross-sectional view and a top view of the fourth embodiment of the light-emitting device respectively. Comparing with the above embodiment, the heat conductive layer 118 of the light emitting device is in the light-emitting stack 104 in the present embodiment. The heat conductive layer 118 comprises a fourth hole $H_4$ substantially aligned with the second hole $H_1$. The view of the fourth hole $H_4$ in the direction from the insulating layer 106 to the light emitting stack 104 is substantially a circle (shown in FIG. 8B). A top-view area of the fourth hole $H_4$ is larger than that of the second part. In other words, the top-view area of the fourth hole $H_4$ is larger than that of the second hole $H_1$. Particularly, the heat conductive layer 118 is among the light-emitting stack 104, the first contact layer 103, and the insulating layer 106. More specifically, the heat conductive layer 118 penetrates the first type semiconductor layer 104a, the active layer 104b, the second type semiconductor layer 104c of the light-emitting stack 104 and the second contact layer 105, thus, the heat conductive layer 118 is surrounded by the light-emitting stack 104, the first contact layer 103, and the insulating layer 106. In another embodiment, the heat conductive layer 118 penetrates the first type semiconductor layer 104a, the active layer 104b, the second type semiconductor layer 104c of the light-emitting stack 104, and is devoid of penetrating the second contact layer 105, thus, the heat conductive layer 118 is surrounded by the light-emitting stack 104, the first contact layer 103, and the second contact layer 105. However, the structure of the heat conductive layer 118 is not limited to the above mentioned embodiments. The fourth hole $H_4$ of the heat conductive layer 118 comprises a diameter D4 larger than the diameter $D_2$ of the second hole $H_1$. The diameter D4 is between 30 μm and 200 μm or between 50 μm and 120 μm. As shown in FIG. 8B, the heat conductive layer 118 comprises an inner periphery 118a and an outer periphery 118b surrounding the inner periphery 118a. A shape of the inner periphery 118a is ring, and the inner periphery 118a surrounds the light-emitting stack 104 under the second hole $H_1$ and forms the fourth hole $H_4$. In the top view of the light-emitting device, the shape of the inner periphery 118a is circle, and the center of the circle is substantially aligned with the center of the second hole $H_1$. A shortest distance d between the outer periphery 118b and the inner periphery 118a is between 10 μm and 50 μm. Moreover, the heat conductive layer 118 penetrates the second contact layer 108 and comprises a thickness W, which is between 2 μm and 15 μm, in the direction parallel with a stacking direction of the light-emitting stack 104. In another embodiment, the center of the inner periphery 118a and that of the outer periphery 118b of the heat conductive layer 118 are substantially aligned with the second hole $H_1$.

Figure 9:
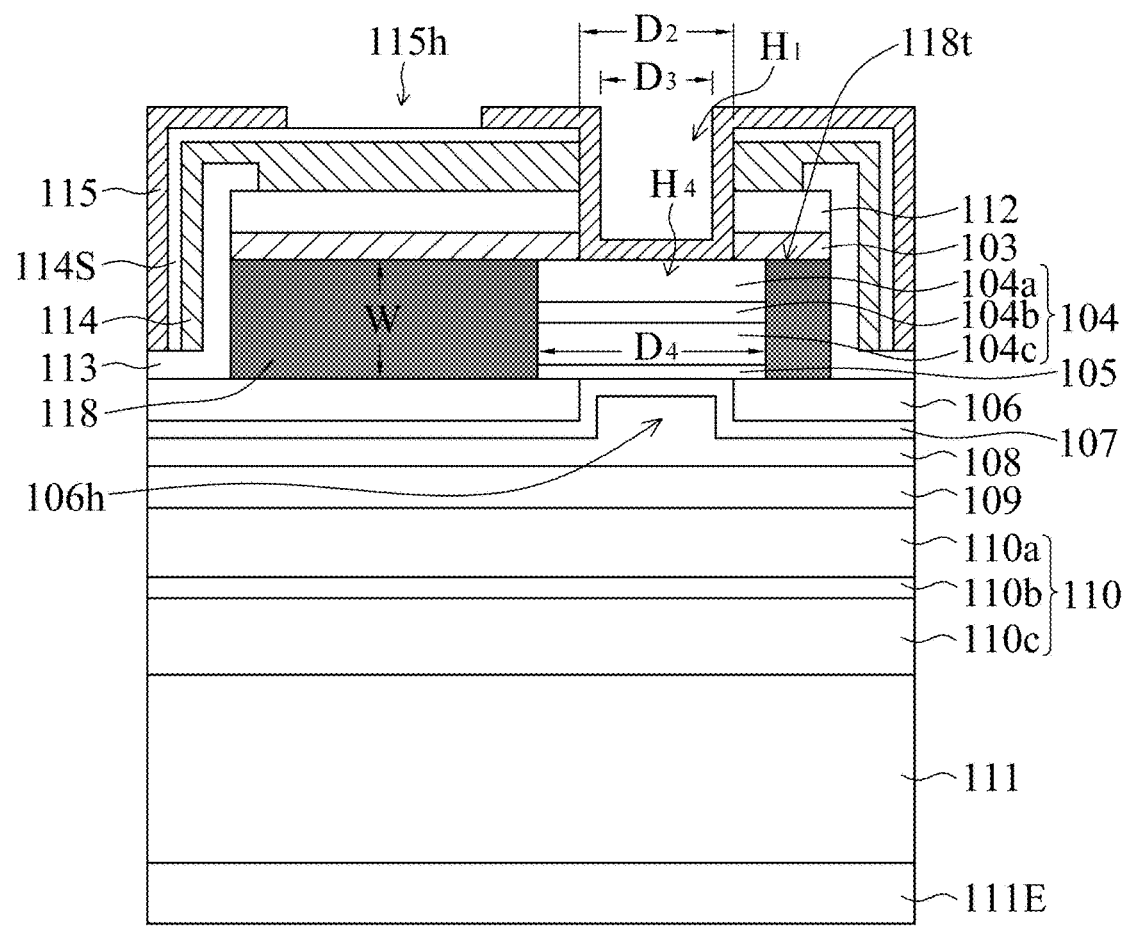
FIG. 9 shows a cross-sectional view of the fifth embodiment of the light-emitting device.

FIG. 9 shows a cross-sectional view of the fifth embodiment of the light-emitting device. Comparing with the above embodiment, the heat conductive layer 118 of the light emitting device is in the light-emitting stack 104, and an area of the heat conductive layer 118 is larger than that in the fourth embodiment. More specifically, in the cross-section view of the light-emitting device shown in FIG. 9, the total area of the heat conductive layer 118 is larger than the area of the light-emitting stack 104 to dissipate the heat generated during the operation of the light-emitting device more effectively. The light-emitting device in the fourth and fifth embodiments can be produced through the steps shown in FIGS. 1A-1Q. After the formation of the second contact layer 105 on the light-emitting stack 104, a part of the light-emitting stack 104 and the second contact layer 105 where is predetermined to form the heat conductive layer 118 is removed. A reactive ion etching by the inductively coupled plasma (ICP) can be applied to remove the light-emitting stack 104 and the second contact layer 105. The area of the light-emitting stack 104 where is removed in the step applied in the fifth embodiment is larger than that in the fourth embodiment. More specifically, in one embodiment, a part of the light-emitting stack 104 where is predetermined to form the heat conductive layer 118, such as parts of the second contact layer 105, the active region 104b, the second type semiconductor layer 104c and the first type semiconductor layer 104a, is removed before the formation of the heat conductive layer 118. Under the circumstances, an etching stop layer (not shown) further locates between the first contact layer 103 and the first type semiconductor layer 104a to prevent the first contact layer 103 from damaging when removing the part of the light-emitting stack 104. Then, forming the heat conductive layer 118 on the location where the light-emitting stack 104 had been removed. The heat conductive layer 118 comprises a thickness W parallel with a stacking direction of the light-emitting stack 104. The thickness W is preferably designed to enable the upper surface 118t of the heat conductive layer 118 align to the second part of the surface of the light-emitting stack 104. The heat conductive layer 118 can be formed by sputter deposition or evaporation. For example, the heat conductive layer 118 is formed by atomic layer chemical vapor deposition (ALD) or electron beam physical vapor deposition (EBPVD). The heat conductive layer 118 in the present embodiment is formed by two-step growth method. The first step is depositing a first part of the heat conductive layer 118 having compact structure via ALD, and the second step is depositing a second part of the heat conductive layer 118 on the first part via EBPVD. However, the method of forming the heat conductive layer 118 is not limited to the above methods.

The foregoing description of preferred and other embodiments in the present disclosure is not intended to limit or restrict the scope or applicability of the inventive concepts conceived by the Applicant. In exchange for disclosing the inventive concepts contained herein, the Applicant desires all patent rights afforded by the appended claims. Therefore, it is intended that the appended claims include all modifications and alterations to the full extent that they come within the scope of the following claims or the equivalents thereof.

What is claimed is:
1. A light-emitting device, comprising:
a substrate;
an insulating layer on the substrate, wherein the insulating layer comprises a first hole;

a light-emitting stack on the insulating layer and comprising an active region comprising a top surface, wherein the top surface comprises a first part and a second part; and an opaque layer covering the first part of the top surface and exposing the second part of the top surface, wherein the second part is directly above the first hole.

2. The light-emitting device according to claim 1, further comprising a sidewall insulating layer, wherein the light-emitting stack comprises a sidewall, and the opaque layer covers a part of the sidewall of the light-emitting stack, and the sidewall insulating layer is between the sidewall of the light-emitting stack and the opaque layer.

3. The light-emitting device according to claim 1, wherein the active region comprises a multi-quantum well structure, and the active region comprises a well number between 30 and 50.

4. The light-emitting device according to claim 1, wherein the first part of the top surface comprises an area and the second part of the top surface comprises an area less than the area of the first part.

5. The light-emitting device according to claim 1, wherein the first hole has a cross-sectional area and the top surface comprises an area, and a ratio of the cross-sectional area to the area of the top surface is between 0.5% and 5%.

6. The light-emitting device according to claim 1, further comprising a reflective layer and a first transparent conductive layer, wherein the reflective layer is between the insulating layer and the substrate, and the first transparent conductive layer is between the insulating layer and the reflective layer, and the first transparent conductive layer is electrically connected to the light-emitting stack through the first hole.

7. The light-emitting device according to claim 1, further comprising a first contact layer and a second hole, wherein the first contact layer is on the light-emitting stack and the second hole penetrates the first contact layer.

8. The light-emitting device according to claim 7, wherein the second hole is directly above the first hole.

9. The light-emitting device according to claim 1, further comprising a second hole penetrated the opaque layer.

10. The light-emitting device according to claim 1, wherein the active region comprises a multi-quantum well structure comprising multiple barrier layers, and the barrier layers comprises $(Al_yGa_{(1-y)})_{1-x}In_xP$, where $0 \leq x < 1$, and $0.4 \leq y \leq 0.7$.

11. A method for manufacturing a light-emitting device, comprising:

forming a light-emitting stack comprising an active region, wherein the light-emitting stack comprises a top surface comprising a first part and a second part;

forming an insulating layer on the light-emitting stack, wherein the insulating layer comprises a first hole;

providing a substrate;

bonding the substrate and the light-emitting stack;

forming an opaque layer on a side of the light-emitting stack opposite to the substrate; wherein the opaque layer covers the first part of the top surface and exposing the second part of the top surface, wherein the second part of the top surface corresponds to the first hole.

12. The method according to claim 11, wherein the light-emitting stack comprises a sidewall, and the method further comprising forming a sidewall insulating layer on the sidewall of the light-emitting stack, wherein the opaque layer covers a part of the sidewall of the light-emitting stack, and the sidewall insulating layer is between the sidewall of the light-emitting stack and the opaque layer.

13. The method according to claim 11, wherein the first part of the top surface comprises an area and the second part of the top surface comprises an area less than the area of the first part.

14. The method according to claim 11, wherein the first hole has a cross-sectional area and the top surface comprises an area, and a ratio of the cross-sectional area to the area of the top surface is between 0.5% and 5%.

15. The method according to claim 11, further comprising forming a first transparent conductive layer on the insulating layer before bonding the substrate and the light-emitting stack, and the first transparent conductive layer is electrically connected to the light-emitting stack through the first hole.

16. The method according to claim 11, further comprising forming a second hole penetrating through the opaque layer.

17. The method according to claim 16, wherein the second hole is directly above the first hole.

18. The method according to claim 11, wherein the active region comprises a multi-quantum well structure, and the active region comprises a well number between 30 and 50.

19. The method according to claim 11, wherein the active region comprises a multi-quantum well structure comprising multiple barrier layers, and the barrier layers comprises $(Al_yGa_{(1-y)})_{1-x}In_xP$, where $0 \leq x < 1$, and $0.4 \leq y \leq 0.7$.

20. The method according to claim 11, further comprising forming a first contact layer before forming the light-emitting stack, and further comprising forming a second hole penetrating through the first contact layer after bonding the substrate and the light-emitting stack.

* * * * *